(12) United States Patent
Panda et al.

(10) Patent No.: US 12,265,377 B2
(45) Date of Patent: *Apr. 1, 2025

(54) AUTONOMOUS SUBSTRATE PROCESSING SYSTEM

(71) Applicant: Applied Materials, Inc., Santa Clara, CA (US)

(72) Inventors: Priyadarshi Panda, Newark, CA (US); Lei Lian, Fremont, CA (US); Pengyu Han, San Jose, CA (US); Todd J. Egan, Fremont, CA (US); Prashant Aji, San Jose, CA (US); Eli Mor, Garden City, ID (US); Alex J. Tom, San Francisco, CA (US); Leonard Michael Tedeschi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,918

(22) Filed: May 30, 2023

(65) Prior Publication Data

US 2023/0305531 A1    Sep. 28, 2023

Related U.S. Application Data

(63) Continuation of application No. 17/143,072, filed on Jan. 6, 2021, now Pat. No. 11,709,477.

(51) Int. Cl.
  *G05B 19/4155* (2006.01)
  *G06N 20/00* (2019.01)

(52) U.S. Cl.
  CPC ......... *G05B 19/4155* (2013.01); *G06N 20/00* (2019.01); *G05B 2219/31368* (2013.01); *G05B 2219/45031* (2013.01)

(58) Field of Classification Search
  CPC ...... G05B 19/4155; G05B 2219/31368; G05B 2219/45031; G05B 13/0265;
  (Continued)

(56) References Cited

U.S. PATENT DOCUMENTS

| 6,304,999 B1 | 10/2001 | Toprac et al. |
| 6,947,803 B1 | 9/2005 | Bode et al. |

(Continued)

FOREIGN PATENT DOCUMENTS

| CN | 101313308 A | 11/2008 |
| CN | 111587478 A | 8/2020 |

(Continued)

OTHER PUBLICATIONS

International Search Report and Written Opinion for International Application No. PCT/US2021/059971, mailed Mar. 14, 2022, 10 Pages.

(Continued)

*Primary Examiner* — Charles R Kasenge
(74) *Attorney, Agent, or Firm* — Lowenstein Sandler LLP

(57) ABSTRACT

A cool cluster comprises one or more transfer chambers; a plurality of process chambers connected to the one or more transfer chambers; and a computing device of the tool cluster. The computing device is to receive first measurements generated by sensors of a first process chamber during or after a process is performed within the first process chamber; determine that the first process chamber is due for maintenance based on processing the first measurements using a first trained machine learning model; after maintenance has been performed on the first process chamber, receive second measurements generated by the sensors during or after a seasoning process is performed within the first process chamber; and determine that the first process chamber is ready to be brought back into service based on (Continued)

processing the second measurements using a second trained machine learning model.

17 Claims, 10 Drawing Sheets

(58) Field of Classification Search
CPC ........ G05B 13/027; G06N 20/00; G06N 3/04; G06N 3/045; H01L 21/67184; H01L 21/67253; H01L 21/67276
See application file for complete search history.

(56) References Cited

U.S. PATENT DOCUMENTS

| | | |
|---|---|---|
| 7,894,927 B2 | 2/2011 | Funk et al. |
| 9,972,478 B2 | 5/2018 | Guha et al. |
| 9,978,621 B1 | 5/2018 | Kraus et al. |
| 10,032,681 B2 | 7/2018 | Bailey, III et al. |
| 10,262,910 B2 | 4/2019 | Feng et al. |
| 10,529,602 B1 | 1/2020 | Panda et al. |
| 10,579,041 B2 | 3/2020 | Nurani et al. |
| 11,709,477 B2 * | 7/2023 | Panda .................. G06N 20/00 700/121 |
| 2004/0110375 A1 | 6/2004 | Chen et al. |
| 2005/0085090 A1 | 4/2005 | Mui et al. |
| 2005/0098535 A1 | 5/2005 | Lansford et al. |
| 2005/0115824 A1 | 6/2005 | Donohue et al. |
| 2007/0169694 A1 | 7/2007 | Schwarm et al. |
| 2007/0249071 A1 | 10/2007 | Lian et al. |
| 2009/0083013 A1 | 3/2009 | Li et al. |
| 2009/0277872 A1 | 11/2009 | Yamamoto et al. |
| 2012/0248061 A1 | 10/2012 | Brown et al. |
| 2015/0099314 A1 | 4/2015 | Saraf et al. |
| 2016/0111307 A1 | 4/2016 | Davis |
| 2016/0181116 A1 | 6/2016 | Berry, III et al. |
| 2017/0098565 A1 | 4/2017 | Lu et al. |
| 2017/0256463 A1 | 9/2017 | Bailey, III et al. |
| 2018/0061721 A1 | 3/2018 | Khaja |
| 2018/0082201 A1 | 3/2018 | Cantwell |
| 2018/0114711 A1 | 4/2018 | Budiarto et al. |
| 2018/0150052 A1 | 5/2018 | Cherian |
| 2018/0304435 A1 | 10/2018 | Xu et al. |
| 2018/0350699 A1 | 12/2018 | Gellineau et al. |
| 2019/0072482 A1 | 3/2019 | Feng et al. |
| 2019/0095797 A1 | 3/2019 | Dhandapani et al. |
| 2019/0171181 A1 | 6/2019 | Nurani et al. |
| 2019/0237337 A1 | 8/2019 | Matsui et al. |
| 2019/0244870 A1 | 8/2019 | Feng et al. |
| 2019/0252163 A1 | 8/2019 | Gottscho |
| 2019/0259674 A1 | 8/2019 | Howald et al. |
| 2019/0299356 A1 | 10/2019 | Xu et al. |
| 2019/0348312 A1 | 11/2019 | Kommisetti et al. |
| 2020/0006100 A1 | 1/2020 | Clark et al. |
| 2020/0083074 A1 | 3/2020 | Clark et al. |
| 2020/0083080 A1 | 3/2020 | Clark et al. |
| 2020/0227294 A1 | 7/2020 | Zhu et al. |
| 2020/0243359 A1 | 7/2020 | Hao et al. |
| 2020/0388545 A1 | 12/2020 | Honda et al. |
| 2021/0080941 A1 | 3/2021 | Entzminger et al. |
| 2022/0171373 A1 * | 6/2022 | Chau ...................... C23C 14/54 |
| 2022/0344184 A1 * | 10/2022 | Sadeghi ................. G01B 11/02 |

FOREIGN PATENT DOCUMENTS

| | | |
|---|---|---|
| JP | H1064886 A | 3/1998 |
| JP | 2003083720 A | 3/2003 |
| JP | 2003209035 A | 7/2003 |
| JP | 2003534661 A | 11/2003 |
| JP | 2018056465 A | 4/2018 |
| JP | 2020053506 A | 4/2020 |
| JP | 2020070470 A | 5/2020 |
| JP | 6705023 B2 | 6/2020 |
| JP | 2020136568 A | 8/2020 |
| JP | 2020155526 A | 9/2020 |
| JP | 2022045906 A | 3/2022 |
| KR | 20080044130 A | 5/2008 |
| KR | 101909477 B1 | 10/2018 |
| KR | 20200112584 A | 10/2020 |
| WO | 2016190905 A1 | 12/2016 |
| WO | 2019182913 A1 | 9/2019 |
| WO | 2019182916 A1 | 9/2019 |
| WO | 2019217348 A1 | 11/2019 |
| WO | 2020159673 A1 | 8/2020 |
| WO | 2020205339 A1 | 10/2020 |
| WO | 2021030833 A1 | 2/2021 |
| WO | 2021231138 A1 | 11/2021 |
| WO | 2021261352 A1 | 12/2021 |

OTHER PUBLICATIONS

International Search Report and Written Opinion for International Application No. PCT/US2021/060130, mailed Mar. 21, 2022, 10 pages.

International Search Report and Written Opinion for International Application No. PCT/US2022/011316, mailed Apr. 22, 2022, 14 Pages.

* cited by examiner

AUTONOMOUS SUBSTRATE PROCESSING SYSTEM

RELATED APPLICATIONS

The present application is a continuation application of U.S. application Ser. No. 17/143,072, filed Jan. 6, 2021, which is incorporated by reference herein.

TECHNICAL FIELD

Embodiments of the present disclosure relate to an autonomous or semi-autonomous substrate processing system, tool and/or process chamber.

BACKGROUND

Traditionally, manufacturing recipes performed by process chambers are static recipes that are applied mechanically and without reacting to in-situ conditions. Additionally, determinations of when to perform maintenance on process chambers and when to bring process chambers back into service are made statically based on set schedules and predetermined recipes. Process chambers generally do not have any autonomy or ability to make their own decisions with regards to process recipes, maintenance, tool qualification, and so on.

SUMMARY

Some of the embodiments described herein cover a substrate processing system comprising one or more transfer chambers, a plurality of process chambers connected to the one or more transfer chambers and a computing device connected to each of the plurality of process chambers. The plurality of process chambers include a first process chamber comprising a first plurality of sensors and a second process chamber comprising a second plurality of sensors. The computing device is to: receive one or more first measurements from at least one of the first plurality of sensors of the first process chamber during or after a first instance of a process performed within the first process chamber; process the one or more first measurements using a trained machine learning model, wherein the trained machine learning model is to generate a first output based on processing of the one or more first measurements; cause a first action to be performed with respect to the first process chamber based on the first output of the trained machine learning model; determine a first result of the first action; and update a training of the trained machine learning model based on the one or more first measurements, the first output, and the first result of the first action.

In some embodiments, a process tool comprises a process chamber, a plurality of sensors connected to the process chamber, and a computing device connected to the process chamber and to each of the plurality of sensors. The computing device is to: receive one or more measurements from at least one of the first plurality of sensors during or after a process performed within the process chamber; process the one or more measurements using a trained machine learning model, wherein the trained machine learning model is to generate an output based on processing of the one or more measurements; cause an action to be performed with respect to the process chamber based on the output of the trained machine learning model; determine a result of the action; and update a training of the trained machine learning model based on the one or more measurements, the output, and the result of the action.

In some embodiments, a substrate processing system comprises one or more transfer chambers, a plurality of process chambers connected to the one or more transfer chambers, and a computing device connected to each of the plurality of process chambers. The plurality of process chambers includes a first process chamber comprising a first plurality of sensors. The computing device is to: receive first measurements generated by the first plurality of sensors of the first process chamber during or after a process is performed within the first process chamber; determine that the first process chamber is due for maintenance based on processing the first measurements from the first plurality of sensors using a first trained machine learning model; after maintenance has been performed on the first process chamber, receive second measurements generated by the plurality of sensors of the first process chamber during or after a seasoning process is performed within the first process chamber; and determine that the first process chamber is ready to be brought back into service based on processing the second measurements from the plurality of sensors using a second trained machine learning model Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
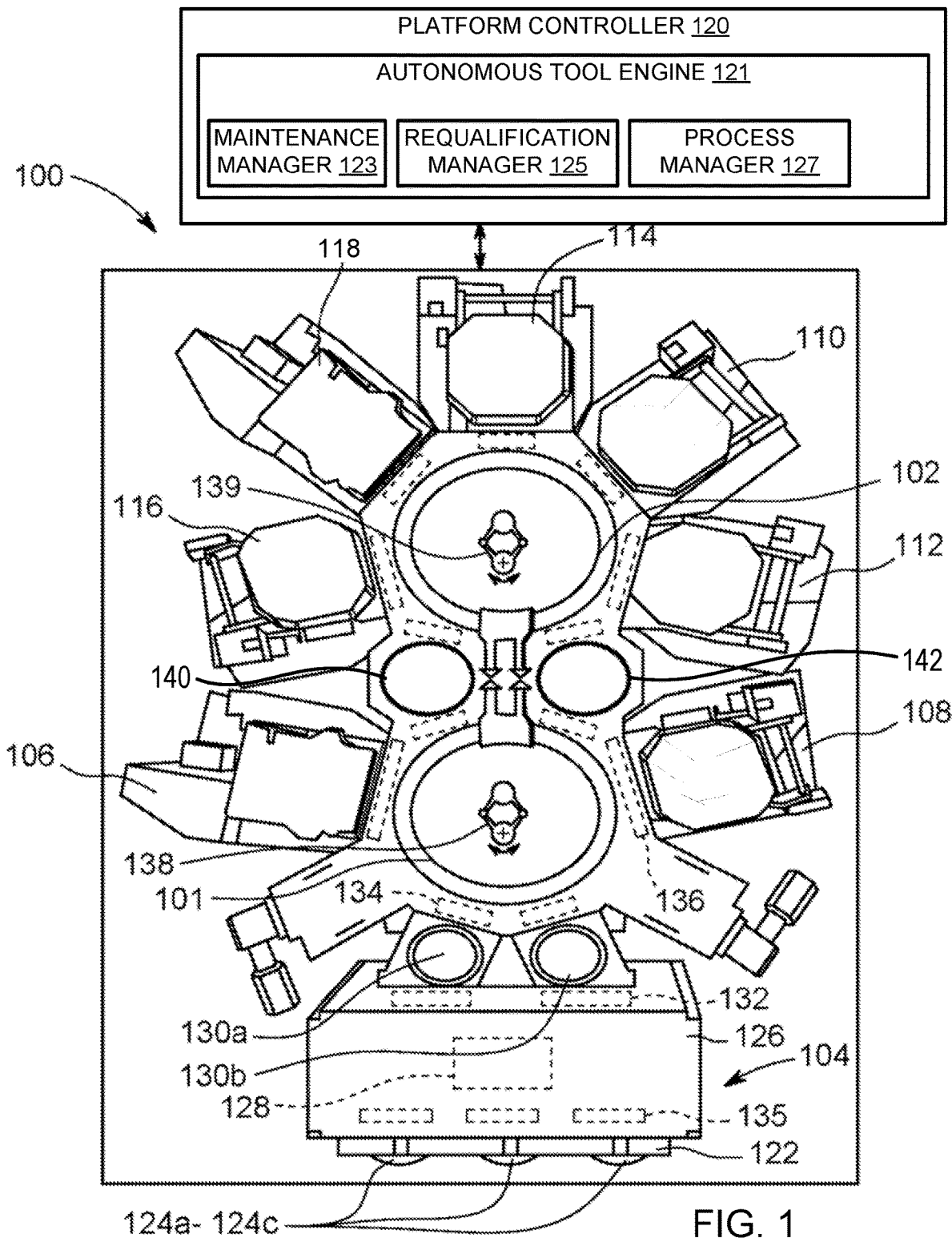
FIG. 1 is a top schematic view of a first example autonomous or semi-autonomous manufacturing system, according to an embodiment.

Embodiments described herein relate to autonomous and semi-autonomous substrate processing systems (e.g., platforms or tool clusters), process tools and process chambers, as well as methods of training such substrate processing systems, tools and/or process chambers and methods of automatically making decisions by such substrate processing systems, tools and/or process chambers. In embodiments, controllers and/or other computing devices for substrate processing systems, process tools and/or process chambers include one or more trained machine learning models that are trained to receive sensor measurements from sensors of process chambers and to provide outputs that enable the computing devices to make decisions as to what actions to perform. Examples of such decisions include decisions to stop an etch process, decisions to schedule a process chamber for maintenance, and decisions to stop seasoning a process chamber after maintenance has been performed. In embodiments, an autonomous tool or semi-autonomous tool is a tool that can make decisions locally without data transfer to remote computing devices. In embodiments, a smart tool (also referred to as an autonomous tool or semi-autonomous tool) is capable of determining when to stop processes, when to perform maintenance, and when to stop seasoning a process chamber and bring the process chamber back to service after maintenance is performed on the process chamber. In embodiments, a smart tool is two or more of determining when to stop an etch process based on an output of a first machine learning model, determining when to perform maintenance on a process chamber based on an output of a second machine learning model, and determining when to stop seasoning a process chamber and bring the process chamber back to service based on an output of a third machine learning model.

In embodiments, trained machine learning models are edge-based models that execute on the tools and/or substrate processing systems (e.g., platforms, transfer chambers, mainframes, factory interfaces, and/or tool clusters) themselves rather than on remote computing devices. Training of the machine learning models may be performed remotely, after which trained machine learning models may be transferred to tools and/or substrate processing systems, or may be performed on the tools and/or substrate processing systems. Retraining or updating of training of the machine learning models may be performed periodically or continuously on the tools and/or substrate processing systems. By moving execution and/or training (including retraining) of the machine learning models to the tools and/or substrate processing systems, latency between generation of sensor measurements and making decisions based on such sensor measurements can be significantly reduced. This improves an ability of the tools and/or substrate processing systems to make real-time decisions for process chambers. Additionally, moving the decision making to the tool and/or substrate processing system reduces an amount of data that is transmitted over a network, increases efficiency, and increases a speed with which decisions can be made. For example, a decision of when to stop an etch process can be made within seconds or fractions of a second from when sensor data that triggers such a decision is received in embodiments that include a machine learning model trained to detect an etch endpoint on the substrate processing system or tool.

In another example, a decision of whether to schedule maintenance on a process chamber may be made after a process is performed on a first substrate and before the process is performed on a next substrate. For example, a decision to take a tool down for service may be made within 1-5 minutes of a substrate being processed in a process chamber of the tool, within less than a minute of the substrate being processed in the process chamber, or even within a few seconds or fractions of a second of the substrate being processed in the process chamber. Such quick response time reduces an exposure of product substrates (substrates that will result in products of devices that will be sold to customers) to process chambers that are out of specification and that could cause contamination of the substrates and/or failure of product that is ultimately manufactured. In another example, a decision of whether to stop seasoning a process chamber after maintenance has been performed on that process chamber may be made between seasoning process runs on the process chamber. This can reduce an amount of time that it takes to requalify a tool and bring it back into service, reducing an overall cost of ownership of the tool and/or increasing a lifetime throughput of the tool. Additionally, dynamically determining when to stop seasoning a process chamber reduces an amount of resources (e.g., gases, wafers, etc.) that are used to perform seasoning.

Referring now to the figures, FIG. 1 is a diagram of a cluster tool 100 (also referred to as a system, substrate processing system or manufacturing system) that is configured for substrate fabrication in accordance with at least some embodiments of the disclosure. The cluster tool 100 includes one or more vacuum transfer chambers (VTM) 101, 102, a factory interface 104, a plurality of processing chambers/modules 106, 108, 110, 112, 114, 116, and 118, and a platform controller 120. A server computing device may also be connected to the cluster tool 100 (e.g., to the platform controller 120 of the cluster tool 100). In embodiments with more than one VTM, such as is shown in FIG. 1, one or more pass-through chambers (referred to as vias) may be provided to facilitate vacuum transfer from one VTM to another VTM. In embodiments consistent with that shown in FIG. 1, two pass-through chambers can be provided (e.g., pass-through chamber 140 and pass-through chamber 142).

The factory interface 104 includes a loading port 122 that is configured to receive one or more substrates, for example from a front opening unified pod (FOUP) or other suitable substrate containing box or carrier, that are to be processed using the cluster tool 100. The loading port 122 can include one or multiple loading areas 124a-124c, which can be used for loading one or more substrates. Three loading areas are shown. However, greater or fewer loading areas can be used.

The factory interface 104 includes an atmospheric transfer module (ATM) 126 that is used to transfer a substrate that has been loaded into the loading port 122. More particularly, the ATM 126 includes one or more robot arms 128 (shown in phantom) that are configured to transfer the substrate from the loading areas 124a-124c to the ATM 126, through doors 135 (shown in phantom, also referred to as slit valves) that connects the ATM 126 to the loading port 122. There is typically one door for each loading port (124a-124c) to allow substrate transfer from respective loading port to the ATM 126. The robot arm 128 is also configured to transfer the substrate from the ATM 126 to load locks 130a, 130b through doors 132 (shown in phantom, one each for each load lock) that connect the ATM 126 to the air locks 130a, 130b. The number of load locks can be more or less than two but for illustration purposes only, two load locks (130a and 130b) are shown with each load lock having a door to connect it to the ATM 126. Load locks 130a-b may or may not be batch load locks.

The load locks 130a, 130b, under the control of the platform controller 120, can be maintained at either an atmospheric pressure environment or a vacuum pressure environment, and serve as an intermediary or temporary holding space for a substrate that is being transferred to/from the VTM 101, 102. The VTM 101 includes a robot arm 138 (shown in phantom) that is configured to transfer the substrate from the load locks 130a, 130b to one or more of the plurality of processing chambers 106, 108 (also referred to as process chambers), or to one or more pass-through chambers 140 and 142 (also referred to as vias), without vacuum break, i.e., while maintaining a vacuum pressure environment within the VTM 102 and the plurality of processing chambers 106, 108 and pass-through chambers 140 and 142. The VTM 102 includes a robot arm 138 (in phantom) that is configured to transfer the substrate from the air locks 130a, 130b to one or more of the plurality of processing chambers 106, 108, 110, 112, 114, 116, and 118, without vacuum break, i.e., while maintaining a vacuum pressure environment within the VTM 102 and the plurality of processing chambers 106, 108, 110, 112, 114, 116, and 118.

A door 134, e.g., a slit valve door, connects each respective load lock 130a, 130b, to the VTM 101. Similarly, a door 136, e.g., a slit valve door, connects each processing module to the VTM to which the respective processing module is coupled (e.g., either the VTM 101 or the VTM 102). The plurality of processing chambers 106, 108, 110, 112, 114, 116, and 118 are configured to perform one or more processes. Examples of processes that may be performed by one or more of the processing chambers 106, 108, 110, 112, 114, 116, and 118 include cleaning processes (e.g., a pre-clean process that removes a surface oxide from a substrate), anneal processes, deposition processes (e.g., for deposition of a cap layer, a hard mask layer, a barrier layer, a bit line metal layer, a barrier metal layer, etc.), etch processes, and so on. Examples of deposition processes that may be performed by one or more of the process chambers include physical vapor deposition (PVD), chemical vapor deposition (CVD), atomic layer deposition (ALD), and so on. Examples of etch processes that may be performed by one or more of the process chambers include plasma etch processes.

Platform controller 120 (e.g., a tool and equipment controller) may control various aspects of the cluster tool 100, e.g., gas pressure in the processing chambers, individual gas flows, spatial flow ratios, plasma power in various process chambers, temperature of various chamber components, radio frequency (RF) or electrical state of the processing chambers, and so on. The controller 120 may receive signals from and send commands to any of the components of the cluster tool 100, such as the robot arms 128, 138, process chambers 106, 108, 110, 112, 114, 116, and 118, load locks 130a-b, slit valve doors, and/or one or more sensors, and/or other processing components of the cluster tool 100. The controller 120 may thus control the initiation and cessation of processing, may adjust a deposition rate and/or target layer thickness, may adjust process temperatures, may adjust a type or mix of deposition composition, may adjust an etch rate, and the like. The controller 120 may further receive and process measurement data (e.g., optical measurement data) from various sensors and make decisions based on such measurement data.

In various embodiments, the controller 120 may be and/or include a computing device such as a personal computer, a server computer, a programmable logic controller (PLC), a microcontroller, and so on. The controller 120 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 120 may include a data storage device (e.g., one or more disk drives and/or solid state drives), a main memory, a static memory, a network interface, and/or other components. The processing device of the controller 120 may execute instructions to perform any one or more of the methodologies and/or embodiments described herein. The instructions may be stored on a computer readable storage medium, which may include the main memory, static memory, secondary storage and/or processing device (during execution of the instructions).

In embodiments, the processing device and memory of controller 120 have an increased capacity as compared to processing power and memory size of traditional controllers for cluster tools. In embodiments, the processing device and memory are sufficient to handle parallel execution and use of multiple trained machine learning models, as well as training of the machine learning models. For example, the memory and processing device may be sufficient to handle parallel execution of 6-15 different machine learning models (e.g., one or more for each of the process chambers 106-108).

In one embodiment, the controller 120 includes an autonomous tool engine 121. The autonomous tool engine 121 may be implemented in hardware, firmware, software, or a combination thereof. The autonomous tool engine 121 is configured to receive and process measurement data generated by one or more sensors of process chambers 106, 108, 110, 112, 114, 116, and 118 during and/or after execution of processes on the process chambers. The sensor measurements may include temperature measurements, gas flow rates, plasma power measurements, pressure measurements, voltage measurements, current measurements, resistance measurements, time measurements, optical measurements (e.g., such as optical emission spectrometry measurements and/or reflectometry measurements), position measurements and/or other types of measurements. Some example measurements include a chamber pressure (e.g., which may be measured in mTorr), a nozzle center channel flow rate (e.g., which may be measured in SCCM), a nozzle middle channel flow rate (e.g., which may be measured in SCCM), a pressure controller (e.g., valve) position (e.g., which may be represented as a percentage open such as 30% open), a total gas flow rate into a chamber (e.g., which may be measured in SCCM), inside and/or outside plasma source currents (e.g., which may be measured in Amps), a plasma source inside to outside current ratio, a source forward power (e.g., which may be measured in Watts), a plasma source matching network capacitor position, a plasma source reflected power (e.g., which may be measured in Watts), a plasma source series capacitor position (e.g., which may be represented as a normalized unitless value), a plasma source shunt capacitor position, an RF bias reflected power (e.g., which may be measured in Watts), an RF bias forward poser (e.g., which may be reflected in Watts), an RF source forward power (e.g., which may be measured in Watts), an RF source reflected power (e.g., which may be measured in Watts), OES spectra measurements for one or more wavelengths or frequencies (e.g., for wavelengths of 3870 nm, 7035 nm, 775 nm, and so on), a plasma source inside voltage, a plasma source outside voltage, one or more chuck/heater temperatures (e.g., such as an electrostatic chuck inner temperature and an electrostatic chuck outer temperature), a helium pressure (e.g., for helium delivered to a gap between a substrate and a chuck supporting the substrate), a helium flow rate (e.g., for the helium delivered to the gap between the substrate and the chuck), a lid temperature, and so on. Some or all of these measurements may be combined to generate a feature vector that is input into a trained machine learning model of the autonomous tool engine 121.

The autonomous tool engine 121 running on platform controller 120 may include one or more trained machine learning models for controlling and/or making decisions for multiple process chambers 106, 108, 110, 112, 114, 116, 118. The one or more trained machine learning models have been trained to receive sensor measurements from and/or associated with a process chamber 106, 108, 110, 112, 114, 116, 118 and to make a prediction, classification or determination about the process chamber or a process to be performed or being performed by the process chamber. Each of the trained machine learning models may be associated with a different decision making process for a process chamber 106, 108, 110, 112, 114, 116, 118.

In one embodiment, one or more of the trained machine learning models is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, least absolute deviations, nonparametric regression, scenario optimization and/or distance metric learning may be performed to train the regression model.

In one embodiment, one or more of the trained machine learning models are decision trees, random forests, support vector machines, or other types of machine learning models.

In one embodiment, one or more of the trained machine learning models is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

One of more of the trained machine learning models may be recurrent neural networks (RNNs). An RNN is a type of neural network that includes a memory to enable the neural network to capture temporal dependencies. An RNN is able to learn input-output mappings that depend on both a current input and past inputs. The RNN will address past and future measurements and make predictions based on this continuous measurement information. For example, sensor measurements may continually be taken during a process, and those sets of measurements may be input into the RNN sequentially. Current sensor measurements and prior sensor measurements may affect a current output of the trained machine learning model. One type of RNN that may be used is a long short term memory (LSTM) neural network.

Some trained machine learning models of the autonomous tool engine 121 may be used for multiple different process chambers that have a common process chamber type and that are used to perform the same or similar processes. For example, process chamber 106 and process chamber 108 may both be etch chambers that perform a same etch process. A trained machine learning model may be used to determine when to schedule each of process chamber 106 and process chamber 108 for maintenance.

Some trained machine learning models may be specific to a particular process chamber 106, 108, 110, 112, 114, 116, 118. For such trained machine learning models, a different instance of the trained machine learning model may have been trained for each of the process chambers 106, 108, 110, 112, 114, 116, 118. For example, the autonomous tool engine 121 may include a first trained machine learning model for determining when to schedule maintenance for process chamber 106, a second trained machine learning model for determining when to schedule maintenance for process chamber 108, a third trained machine learning model for determining when to schedule maintenance for process chamber 110, a fourth trained machine learning model for determining when to schedule maintenance for process chamber 112, a fifth trained machine learning model for determining when to schedule maintenance for process chamber 114, a sixth trained machine learning model for determining when to schedule maintenance for process chamber 116, and a seventh trained machine learning model for determining when to schedule maintenance for process chamber 118.

Some trained machine learning models of autonomous tool engine 121 use all sensor measurements generated by a process chamber and/or for a process chamber (e.g., for a process performed on the process chamber). Some trained machine learning models of autonomous tool engine 121 use a subset of generated sensor measurements. For example, a trained machine learning model trained to determine an etch endpoint may receive as an input measurements from one or more optical sensors, such as a reflectometry signal and/or an optical emission spectroscopy signal.

In one embodiment, autonomous tool engine 121 includes a maintenance manager 123. Maintenance manager 123 includes one or more trained machine learning models that are trained to receive sensor measurements of a process chamber and/or of a process from sensors associated with the process chamber and to output a decision as to whether or not maintenance should be performed on the process chamber. In one embodiment, maintenance manager 123 includes a different trained machine learning model for each process chamber 106, 108, 110, 112, 114, 116, 118 of cluster tool 100. In one embodiment, maintenance manager 123 includes a different trained machine learning model for each type of process chamber. In one embodiment, maintenance manager 123 includes a different trained machine learning model for each type of process chamber that performs a particular process. For example, process chambers 106, 108, 110 and 112 may be the same type of process chamber, where process chambers 106, 108 perform a first process and process chambers 110, 112 perform a second process. Accordingly, maintenance manager 123 may include a first trained machine learning model for process chambers 106, 108 and a second trained machine learning model for process chambers 110, 112.

In one embodiment, autonomous tool engine 121 includes a requalification manager 125. Requalification manager 125 includes one or more trained machine learning models that are trained to receive sensor measurements of a process chamber and/or of a process from sensors associated with the process chamber and to output a decision as to whether or not the process chamber is properly seasoned and ready to return to service. The sensor measurements may be received during and/or after a seasoning process is performed in a process chamber. The seasoning process may be performed while a blanket substrate, a sensor substrate, a bare substrate or a test substrate is in the process chamber in embodiments. In one embodiment, requalification manager 125 includes a different trained machine learning model for each process chamber 106, 108, 110, 112, 114, 116, 118 of cluster tool 100. In one embodiment, requalification manager 125 includes a different trained machine learning model for each type of process chamber. In one embodiment, requalification manager 125 includes a different trained machine learning model for each type of process chamber that performs a particular process. For example, process chambers 106, 108, 110 and 112 may be the same type of process chamber, where process chambers 106, 108 perform a first process and process chambers 110, 112 perform a second process. Accordingly, requalification manager 125 may include a first trained machine learning model for process chambers 106, 108 and a second trained machine learning model for process chambers 110, 112.

In one embodiment, autonomous tool engine 121 includes a process manager 127. Process manager 127 includes one or more trained machine learning models that are trained to receive sensor measurements of a process chamber and/or of a process from sensors associated with the process chamber and to output a decision as to whether or not particular process conditions are met, such as whether or not an etch endpoint has been reached. In one embodiment, process manager 127 includes a different trained machine learning model for each process chamber 106, 108, 110, 112, 114, 116, 118 of cluster tool 100. In one embodiment, process manager 127 includes a different trained machine learning model for each type of process chamber. In one embodiment, process manager 127 includes a different trained machine learning model for each type of process chamber that performs a particular process. For example, process chambers 106, 108, 110 and 112 may be the same type of process chamber, where process chambers 106, 108 perform a first process and process chambers 110, 112 perform a second process. Accordingly, process manager 127 may include a first trained machine learning model for process chambers 106, 108 and a second trained machine learning model for process chambers 110, 112.

In embodiments, inputs to at least one of the machine learning models of process manager 127 are feature vectors including one or more sensor measurements from one or more points in time during a manufacturing process, and the outputs of the machine learning model are etch endpoint decisions (e.g., indicating that an etch endpoint is reached or that an etch endpoint is not reached), estimated film thickness values and/or estimated trench depths. In one embodiment, a trained neural network is trained to receive reflectometry measurements of deposited layers on a substrate and/or optical emissions spectroscopy measurements generated during etching of a deposited layer on a substrate as an input and to output at least one of an estimated film thickness and/or a trench depth. The estimated film thickness and/or trench depth may then be compared to a target film thickness and/or trench depth by process manager 127. The target film thickness and/or trench depth may be included in a process recipe for etching the film. If the estimated film thickness equals the target film thickness and/or the estimated trench depth equals the target trench depth, then process manager 127 determines that an etch endpoint is reached.

The trained machine learning model may have been trained using a training dataset including multiple data items that each include spectra (e.g., reflectometry measurements of films having particular thicknesses and/or trenches with particular depths) of films that are generated from optical sensors such as OES sensors and/or reflectometry sensors during a process (e.g., during a deposition process or etch process) and associated thickness values and/or depth values measured after the process (e.g., optical critical dimension (OCD) measurements). A machine learning model such as a neural network (e.g., a convolutional neural network) or a regression model (e.g., a Gaussian regression model or a linear regression model) may be trained to correlate the optical sensor measurements (e.g., spectra information) to film thickness and/or trench depth. The trained machine learning model can then receive optical sensor measurements (e.g., spectra information) during a process (e.g., an etch or deposition process), and estimate a film thickness and/or trench depth based on the optical sensor measurements.

In one embodiment, training the machine learning model includes performing principal component analysis to determine a set of spectra information that has a largest impact on film thickness and/or trench depth. For example, through principal component analysis, the system may determine that y (trench depth or film thickness) is a function of $x_1$, $x_2$, through $x_n$ (where $x_i$ for i from 1 to n are principal components of the spectra information (e.g., different wavelengths)), as set forth in the equation below:

$$y = F(a_i, x_i)$$

for i=1 to n, where $a_i$ are weights for the respective principal components $x_i$.

In one embodiment, the trained machine learning model processes optical sensor measurements periodically (e.g., every 50-100 milliseconds) during a process such as an etch process. For each input, the trained machine learning model may output a film thickness and/or trench depth. The process manager 127 may compare the estimated trench depth and/or film thickness to a target trench depth and/or film thickness to determine whether an etch endpoint has been reached or will be reached before the next sensor measurements are processed. In one embodiment, process manager 127 determines an estimated etch rate based on multiple film thickness and/or trench depth estimates and the associated times at which measurements associated with the film thickness and/or trench depth estimates were generated. For example, the formula $(D_1-D_2)/(T_2-T_1)=R$ may be used to determine etch rate, where $D_1$ is the thickness at time $T_1$, $D_2$ is the thickness at time $T_2$ and R is the etch rate. Thickness values over a last few measurements may therefore be examined to estimate etch rate. The estimated etch rate may then be extrapolated into the future to estimate when an etch endpoint will be reached. Processing logic may include information identifying how long it takes to process optical sensor measurements to determine a film thickness and/or trench depth. This information may be compared to the estimated time at which an etch endpoint is predicted to be reached. If the estimated trench endpoint will be reached before a next set of optical measurements can be processed by the trained machine learning model, then the time at which the estimated trench endpoint will be reached may be used to determine when to stop the etch process. In one embodiment, the process manager 127 uses 2-10 estimates of film thickness and/or trench depth based on previous optical sensor measurements to determine an etch rate and extrapolates the etch rate into the future to predict the next 2-10 data points (i.e., the estimated film thickness and/or trench depth to be output by the trained machine learning model for the next 2-10 sets of optical measurements). In one embodiment, the trained machine learning model is a recurrent neural network (RNN). In one embodiment, the trained machine learning model is a neural network (e.g., a CNN) that receives static spectra information. In one embodiment the trained machine learning model is a linear regression model and in another embodiment the machine learning model is a Gaussian regression model. In one embodiment, the trained machine learning model is a random forest.

In embodiments, the sensor measurements (e.g., OES and/or reflectometry spectra information) are correlated to actual OCD information rather than to a yes/no decision as to whether an etch endpoint has been reached. Correlating the sensor measurements to actual OCD information has been shown to increase accuracy by 20-30% over correlating merely to etch endpoint decisions.

Controller 120 may be operatively connected to a server (not shown). The server may be or include a computing device that operates as a factory floor server that interfaces with some or all tools in a fabrication facility. The server may perform training to generate the trained machine learning models, and may send the trained machine learning models to autonomous tool engine 121 on platform controller 120. Alternatively, the machine learning models may be trained on platform controller 120.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

Each of the trained machine learning models of the autonomous tool engine 121 may be periodically or continuously retrained to achieve continuous learning and improvement of the trained machine learning models. Each model may generate an output based on an input, an action may be performed based on the output, and a result of the action may be measured. In some instances the result of the action is measured within fractions of a second (e.g., milliseconds), seconds or minutes, and in some instances it takes longer to measure the result of the action. For example, one or more additional processes may be performed before a result of the action can be measured. The action and the result of the action may indicate whether the output was a correct output and/or a difference between what the output should have been and what the output was. Accordingly, the action and the result of the action may be used to determine a target output that can be used as a label for the sensor measurements. Once the result of the action is determined, the input (i.e., sensor measurements), the output of the trained machine learning model, and the target output of the machine learning model (or the action and the result of the action) may be used as a new training data item. The new training data item may then be used to further train the trained machine learning model. This retraining process may be performed on-tool by the autonomous tool engine 121 of the platform controller 120.

In one embodiment, process manager 127 includes one or more trained machine learning models that have been trained to detect etch endpoints, film thickness and/or etch depth. Such trained machine learning models trained to detect etch endpoints, film thickness and/or trench depth may be trained from a training dataset including optical measurements (e.g., reflectometry measurements and/or optical emission spectroscopy measurements) and labels indicating film thickness and/or trench depth, as discussed above. In one embodiment, optical measurements provide spectra information, which may be correlated to depth or thickness information and/or to an etch endpoint. The spectra information, which may include reflectometry information and/or optical emission spectroscopy information, may then be input into a trained machine learning model to produce a thickness or depth (e.g., trench depth) output. The thickness or depth output may be compared to a target thickness or depth to determine whether an etch endpoint has been reached. A similar process may be performed to measure target thicknesses of films during deposition processes. For example, a trained machine learning model of process manager 127 may use optical measurements to determine when a film being deposited has reached a target thickness, and a deposition process may be stopped when the film reaches the target thickness.

Different etch endpoint detection machine learning models may be trained for each etch recipe and/or for each process chamber. Once the trained machine learning model is employed by platform controller 120 (e.g., by process manager 127), optical measurements may be periodically or continuously generated by optical sensors of an etch chamber during an etch process. These optical measurements may be processed by a trained machine learning model of process manager 127 to determine when an etch endpoint has been reached and when to stop an etch process (or a step in an etch process). Afterwards, thickness or depth measurements and/or other optical critical dimension (OCD) measurements may be performed of a substrate having a film that was etched by the etch process. The OCD measurements may be performed, for example, using normal-incidence spectroscopic ellipsometry, optical scatterometry, scanning electron microscopy, and/or other OCD measurement techniques. The measured thickness or depth may be compared to a target thickness or depth, and a difference may be used along with the output of the machine learning model and the sensor measurements that were input into the machine learning model to update a training of the machine learning model. In one embodiment, a training data item including the sensor measurements, a predicted OCD and an actual measured OCD are used to further train the machine learning model. The trained machine learning model may be retrained after every lot or after every substrate is processed. For example, after every 25 wafers the machine learning model may be updated, and that updated machine learning model, which has increased accuracy and reflects a current condition of a process chamber, may be used for processing the next 25 wafers. This provides very accurate depth control for etch processes, and can improve yield by about 0.2-0.3% in embodiments.

In one embodiment, requalification manager 125 includes one or more trained machine learning models that have been trained to detect when a process chamber has recovered (e.g., when a process chamber is ready to return to service and start processing product substrates again) after preventative maintenance or other maintenance was performed on the process chamber. Such trained machine learning models trained to detect recovery from maintenance may be trained from a training dataset including many different measurements generated by one or more process chambers during seasoning processes. The many different measurements may include optical measurements of a substrate (e.g., reflectometry measurements and/or optical emission spectroscopy measurements), pressure measurements, power measurements, voltage measurements, current measurements, other electrical measurements, temperature measurements, and so on generated during a seasoning process, and labels indicating whether or not the process chamber was ready to return to service after the seasoning process at which the combined sensor measurements were taken was complete.

Different maintenance recovery detection machine learning models may be trained (e.g., using a supervised learning or semi-supervised learning process) for each process chamber and/or for each pair of a process chamber and a process or set of processes performed on that process chamber. Once the trained machine learning model is employed by platform controller 120 (e.g., by requalification manager 125), sensor measurements may be periodically (e.g., every 10 seconds, every 30 seconds, every minute, etc.) or continuously generated by multiple sensors of a process chamber during and/or after a seasoning process. These measurements may be processed by a trained machine learning model of requalification manager 125 to determine when enough seasoning processes have been performed on the process chamber after a maintenance event, and thus when the process chamber is ready to return to service. Additionally, these measurements may be processed by the trained machine learning model to determine whether to end a current seasoning process. Afterwards, one or more test process may be performed on the process chamber, and a result of the test process(es) may be that the process chamber is requalified or that the process chamber is not requalified (indicating that more seasoning processes should be run on the process chamber). In one embodiment, the test processes that may be performed include one or more of a blanket wafer etch process in which a blanket wafer etch rate and/or etch uniformity are measured, a patterned wafer etch process in which a patterned wafer etch rate and/or etch uniformity are measured and/or a particle test process in which a particle test wafer is processed and then particles are counted on the particle test wafer. If the blanket wafer etch rate and/or etch uniformity are within tolerance of a target blanket wafer etch rate and a target blanket wafer etch uniformity, the patterned wafer etch rate and/or etch uniformity are within tolerance of a target patterned wafer etch rate and a target patterned wafer etch uniformity and/or the particle count is within tolerance of a target particle count, then the process chamber may be requalified. In one embodiment, the target particle count is fewer than a threshold number of particles of a particular size or larger. For example, the target particle count could be fewer than five particles that are 22 nm in diameter or larger.

In one embodiment, a training data item including the sensor measurements, a prediction as to whether the process chamber is ready to return to service and machine learning output as to whether the process chamber was actually ready to return to service (e.g., an indication that the process chamber passed a requalification test or did not pass a requalification test) is used to update a training of the trained machine learning model. The trained machine learning model may be retrained each time after the process chamber (or after other process chambers) is returned to service after being taken down for maintenance. Embodiments reduce the number of repetitions of a seasoning process that are performed prior to bringing a process chamber back into service after maintenance. For example, a standard process for seasoning an etch chamber may be to run 25 iterations of a seasoning process on the etch chamber, and to then perform a test process on the process chamber. However, in embodiments processing logic may determine immediately when the process chamber is ready to have a test process run rather than waiting until a full 25 iterations of the seasoning process have been completed. In some embodiments, no test process is run after the trained machine learning model has indicated that a process chamber is ready to return to service.

In one embodiment, a trained machine learning model of requalification manager 125 is trained to output a chamber condition index (CCI) value for a process chamber based on sensor measurements input during a seasoning process. The chamber condition index (CCI) value may be compared to a threshold CCI value, and if the CCI value output by the trained machine learning model meets or exceeds the threshold CCI value, then the requalification manager 125 may determine that the process chamber is ready to return to service. If the predicted CCI value does not meet the CCI threshold, then further seasoning processes may be performed. Requalification manager 125 may also determine how close the process chamber is to being ready for service based on a difference between the predicted CCI value and the CCI threshold.

In embodiments, the CCI value for a process chamber may be based on one or more etch rate values (e.g., mean etch rate values) and/or etch uniformity values measured based on a blanket wafer etch process and/or a patterned wafer etch process. The CCI value may also be based on a particle count of a particle wafer processed by a process chamber after seasoning is performed. The CCI value for a chamber may be measured by performing one or more requalification tests after seasoning is performed on a process chamber. The CCI value may, in some embodiments, be a normalized value that is correlated to blanket wafer etch rate, blanket wafer etch uniformity, patterned wafer etch rate, patterned wafer etch uniformity and/or particle count. A CCI value of 1 may represent test results that show a target blanket wafer etch rate, a target blanket wafer etch uniformity, a target patterned wafer etch rate, a target patterned wafer etch uniformity and/or a target particle count. A CCI value of less than 1 may indicate a deviation from one or more of the target blanket wafer etch rate, the target blanket wafer etch uniformity, the target patterned wafer etch rate, the target patterned wafer etch uniformity and/or the target particle count. In one embodiment, a CCI threshold is some value (e.g., 0.9) that represents an acceptable combined deviation from the target blanket wafer etch rate, the target blanket wafer etch uniformity, the target patterned wafer etch rate, the target patterned wafer etch uniformity and/or the target particle count.

A requalification test may be performed on a process chamber that has been identified as ready to return to service (e.g., after the trained machine learning model outputs a predicted CCI value that is greater than a CCI threshold), and a result of the test may be an actual measured CCI value. The requalification test may include performing a an etch process on a blanket wafer (e.g., a wafer with a blanket or uniform film of an oxide or nitride film) and measuring a blanket wafer etch rate and/or a blanket wafer etch uniformity. The requalification test may additionally or alternatively include performing an etch process on a patterned wafer and measuring a patterned wafer etch rate and/or a patterned wafer etch uniformity. The requalification test may additionally or alternatively include performing a process (e.g., an etch process) on a bare wafer or blanket wafer, and counting particles on the wafer. An actual CCI may be computed based on the blanket wafer etch rate, patterned wafer etch rate and/or particle count. If the actual measured chamber condition index value meets or exceeds the threshold, then the process chamber may be returned to service. The machine learning model may then be updated using a data point comprising the sensor measurements, the predicted chamber condition index value and the actual chamber condition index value.

In one embodiment, maintenance manager 123 includes one or more trained machine learning models that have been trained to detect when maintenance should be performed on a process chamber. Such trained machine learning models trained to detect when a process chamber is due for maintenance may be trained from a training dataset including many different measurements generated by one or more process chambers during processes performed on product substrates (e.g., on product wafers). The many different measurements may include optical measurements of a substrate (e.g., reflectometry measurements and/or optical emission spectroscopy measurements), pressure measurements, power measurements (e.g., bias power, source power, plasma power, etc.), voltage measurements, current measurements, other electrical measurements, temperature measurements, and so on generated during a process, and labels indicating whether or not the process chamber was due for maintenance after the process at which the combined sensor measurements were taken was complete. In embodiments, the sensor measurements include up to or about 165 different sensor measurements, each taken periodically during a process. Additionally, occasionally a test process may be run using a test substrate, blanket substrate (substrate with a uniform coating that is not patterned), bare substrate, sensor substrate (substrate with multiple sensors disposed thereon), etc. Sensor measurements from the process chamber (and optionally from the sensor substrate) may be generated and input into the trained machine learning model to generate an output.

Different maintenance prediction machine learning models may be trained for each process chamber and/or for each pair of a process chamber and a process or set of processes performed on that process chamber. Once the trained machine learning model is employed by platform controller 120 (e.g., by maintenance manager 123), sensor measurements may be periodically or continuously generated by multiple sensors of a process chamber (and/or sensor substrate) during a product process and/or an occasional test process. These measurements may be processed by a trained machine learning model of maintenance manager 123 to determine when the process chamber warrants maintenance, and thus when the process chamber should be taken down for maintenance. Examples of maintenance include cleaning the process chamber, replacing one or more parts of the process chamber, and so on. In embodiments, the maintenance prediction machine learning models identify a type of maintenance that should be performed on the process chamber based on the sensor measurements. For example, a trained machine learning model may indicate that a process chamber should be cleaned, that a protective liner should be replaced, that a process kit ring should be replaced, that a showerhead should be replaced, and so on.

In one embodiment, a machine learning model of maintenance manager 123 is trained to receive sensor measurements as inputs and to output a chamber condition index (CCI) or chamber process condition index (CPCI) for each substrate processed by a chamber. One or more metrology measurements may later be performed on the substrate (optionally after one or more additional processes are performed on the substrate to determine one or more OCDs of the substrate or devices on the substrate. The OCDs may correlate to the CCI value or the CPCI value determined for that substrate based on the performed process. If OCD measurements for the substrate deviate from target OCD values by more than a threshold amount, then this may indicate that maintenance should have been performed on the process chamber that performed the process. A data item may be generated based on the sensor measurements generated during the process, the CCI or CPCI value output by the trained machine learning model, and a) an indication as to whether the measured OCD values deviated from target OCD values and/or an amount that the measured OCD values deviated from the target OCD values and/or b) an indication as to whether maintenance should have been performed.

After a process chamber has been marked as due for being serviced, a technician may determine whether the process chamber actually should be serviced and/or a type of maintenance that should be performed on the process chamber. In one embodiment, a training data item including the sensor measurements, a prediction as to whether the process chamber is due for maintenance (and/or a type of maintenance to be performed) and an indication as to whether maintenance was actually warranted for the process chamber is used to update a training of the trained machine learning model. The trained machine learning model may be retrained each time after the process chamber (or after other process chambers) is scheduled for maintenance. Alternatively, or additionally, the machine learning model may be continuously or periodically retrained using data points associated with substrates processed by a process chamber, where the data points include sensor measurements, CCI or CPCI values, differences between target OCD values and measured OCD values and/or indications as to whether maintenance should have been performed. Embodiments reduce the number of substrates that get processed by a process chamber that needs to be serviced, and additionally ensures that process chambers are not serviced more frequently than is called for.

In one embodiment, a trained machine learning model of maintenance manager 123 is trained to output a CCI value or CPCI value for a process chamber based on sensor measurements input during a manufacturing process. The CCI or CPCI value may be compared to a threshold CCI or CPCI value, and if the CCI or CPCI value output by the trained machine learning model is below the threshold CCI or CPCI value (or if the output CCI or CPCI value is above the threshold in some embodiments), then the maintenance manager 123 may determine that the process chamber should be taken down for maintenance. If the CCI or CPCI value is above the CCI or CPCI threshold (or if the output CCI or CPCI value is below the threshold in some embodiments), then further manufacturing processes may be performed in the process chamber without first scheduling maintenance for the process chamber. Maintenance manager 123 may also determine how close the process chamber is to being due for maintenance based on a difference between the predicted CCI or CPCI value and the CCI or CPCI threshold.

In various embodiments, the server may be and/or include a computing device such as a personal computer, a server computer, a programmable logic controller (PLC), a microcontroller, and so on. The server may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The server may include a data storage device (e.g., one or more disk drives and/or solid state drives), a main memory, a static memory, a network interface, and/or other components. The processing device of the server may execute instructions to train machine learning models and to send the trained machine learning models to platform controllers 120 and/or to controllers of individual tools (e.g., controllers of process chambers) in embodiments. The instructions may be stored on a computer readable storage medium, which may include the main memory, static memory, secondary storage and/or processing device (during execution of the instructions).

In some instances, one or more processes may be performed on a substrate in a first cluster tool (e.g., cluster tool 100). Measurements from these processes may be input into one or more trained machine learning models, which may then generate outputs. Actions may be performed based on the outputs, and results of the actions may be determined or measured. The measurements, outputs, actions and/or results may then be used to update a training of the machine learning model(s) (e.g., the machine learning models of maintenance manager 123, requalification manager 125 and/or process manager 127). The updating of the trained machine learning models may be performed on the server or on the platform controller 120. The updated versions of the trained machine learning model(s) may be sent to the server, which may propagate the updated versions of the trained machine learning models to other cluster tools that have similar process chambers and/or that perform similar processes.

Figure 2:
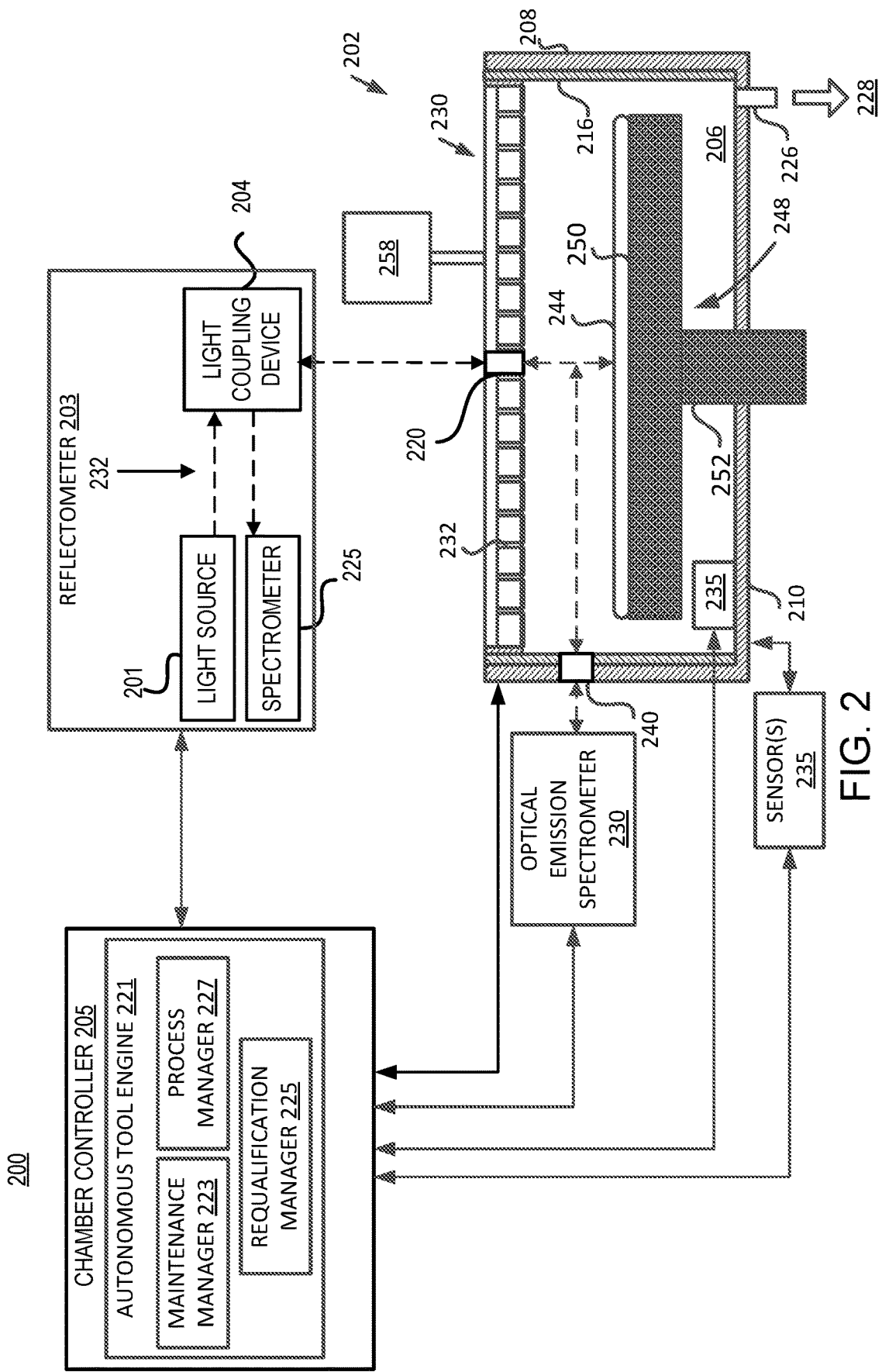
FIG. 2 depicts a sectional view of an autonomous or semi-autonomous processing chamber, according to an embodiment.

FIG. 2 is a sectional view of a semiconductor processing tool 200 including a process chamber 202 and a chamber controller 205 operatively connected to the process chamber 202. Chamber controller 205 may be mounted to the process chamber 230, or may be disposed near the process chamber (e.g., connected to another component of a substrate processing system). The process chamber 202 may be an etch process chamber, a deposition chamber, an anneal chamber, or other type of process chamber used to process substrates (e.g., wafers) such as semiconductor substrates. For example, the processing chamber 202 may be a chamber for a plasma etcher or plasma etch reactor, a plasma cleaner, a CVD or ALD reactor (e.g., such as a plasma enhanced CVD or ALD reactor), an ion assisted deposition (IAD) chamber, a physical vapor deposition (PVD) chamber, and so forth.

In one embodiment, the processing chamber 202 includes a chamber body and a showerhead 230 that encloses an interior volume 206. The showerhead 230 may include a showerhead base and a showerhead gas distribution plate. Alternatively, the showerhead 230 may be replaced by a lid and a nozzle in some embodiments, or by multiple pie shaped showerhead compartments and plasma generation units in other embodiments. The chamber body may be fabricated from aluminum, stainless steel or other suitable material such as titanium (Ti). The chamber body generally includes sidewalls 208 and a bottom 210. A liner 216 may be disposed adjacent the sidewalls 208 to protect the chamber body.

An exhaust port 226 may be defined in the chamber body, and may couple the interior volume 206 to a pump system 228. The pump system 228 may include one or more pumps and throttle valves utilized to evacuate and regulate the pressure of the interior volume 206 of the processing chamber 202.

The showerhead 230 (or lid) may be supported on the sidewalls 208 of the chamber body. The showerhead 230 (or lid) may be opened to allow access to the interior volume 206 of the processing chamber 202, and may provide a seal for the processing chamber 202 while closed. A gas panel 258 may be coupled to the processing chamber 202 to provide process and/or cleaning gases to the interior volume 206 through the showerhead 230 or lid and nozzle. Showerhead 230 may be used for processing chambers used for dielectric etch (etching of dielectric materials). The showerhead 230 may include a gas distribution plate (GDP) and may have multiple gas delivery holes 232 throughout the GDP. The showerhead 230 may include the GDP bonded to an aluminum base or an anodized aluminum base. The GDP may be made from Si or SiC, or may be a ceramic which is coated with $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a coated ceramic component coated with $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, coated with $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 200 include halogen-containing gases, such as $C_2F_6$, $SF_6$, $SiCl_4$, HBr, $NF_3$, $CF_4$, $CHF_3$, $CH_2F_3$, F, $NF_3$, $C_{12}$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A heater assembly 248 is disposed in the interior volume 206 of the processing chamber 202 below the showerhead 230 or lid. The heater assembly 248 includes a support 250 that holds a substrate 244 during processing. The support 250 is attached to the end of a shaft 252 that is coupled to the chamber body via a flange. The support 250, shaft 252 and flange may be constructed of a material containing AlN, for example. The support 250 may further include mesas (e.g., dimples or bumps). The support may additionally include wires, for example, tungsten wires (not shown), embedded within the heater material of the support 250. In one embodiment, the support 250 may include metallic heater and sensor layers that are sandwiched between AlN ceramic layers. Such an assembly may be sintered in a high-temperature furnace to create a monolithic assembly. The layers may include a combination of heater circuits, sensor elements, ground planes, radio frequency grids and metallic and ceramic flow channels.

Exemplary chamber components of the process chamber 202 include, without limitations, an electrostatic chuck, a nozzle, a gas distribution plate, a shower head (e.g., 230), an electrostatic chuck component, a chamber wall (e.g., 208), a liner (e.g., 216), a liner kit, a gas line, a chamber lid, a nozzle, a single ring, a processing kit ring, edge ring, a base, a shield, a plasma screen, a flow equalizer, a cooling base, a chamber viewport, a bellow, any part of a heater assembly (including the support 250, the shaft 252, the flange), faceplate, blocker plate, and so on.

In embodiments, process chamber includes many different sensors 235, 203, 230. The sensors may include optical sensors, such as optical emission spectrometer 230 and/or reflectometer 203. The sensors 235 may additionally include thermal sensors, pressure sensors, power sensors, other electrical sensors, flow rate sensors, and so on. Some sensors 235 may be internal to the process chamber 202, while other sensors 235 may be external to the process chamber 202 and measure the flow and/or delivery of gases, power, etc. to the process chamber 230. In one embodiment, sensors 235 generate about 165 different sensor measurements for process chamber 202.

Chamber controller 205 may serve the same or a similar function as platform controller 120, but may be configured to perform operations for one or a few process chambers (e.g., for process chamber 202). For example, chamber controller 205 may be configured to control etch chambers of a cluster tool, or etch chambers that perform a particular etch process. In embodiments, chamber controller 205 includes an autonomous tool engine 221, which may include a maintenance manager 223, a requalification manager 225 and/or a process manager 227. The requalification manager 225, process manager 227, maintenance manager 223 and autonomous tool engine 221 may correspond to the like named components of FIG. 1 in embodiments. For a single platform with multiple process chambers attached thereto, each of the process chamber may include its own dedicated chamber controller 205. Alternatively, some of the process chambers attached to a cluster tool or mainframe may share a common chamber controller. In one embodiment, chamber controller 205 is not used, and instead a platform controller 120 is used to control all of the process chambers attached to a cluster tool.

Process chamber 202 may include one or more windows or viewports 220, 240. The windows or viewports may be quartz, glass, sapphire, diamond, silicon carbide, a transparent crystal, or an optically transparent ceramic, for example. In one embodiment, the process chamber 202 includes a window 220 in a lid, nozzle or showerhead 230, and further includes a viewport 240 in a sidewall 216.

In embodiments, a reflectometer 203 is coupled to the window 220. The reflectometer 203 includes a light source 201 (e.g., a broadband light source or other source of electromagnetic radiation), a light coupling device 204 (e.g., a collimator or a mirror), and a spectrometer 225. The light source 201 and spectrometer 225 may be optically coupled to the light coupling device 204 through one or more fiber optic cable 232.

In various embodiments, the light coupling device 204 may be adapted to collimate or otherwise transmit light in two directions along an optical path. A first direction may include light from the light source 201 that is to be collimated and transmitted into the chamber 206 through the window 220. A second direction may be reflected light that has reflected off of a substrate 244 and back through the window 220 that passes back into the light coupling device 204. The reflected light may be focused into the fiber optic cable 232 and thus directed to the spectrometer 225 in the second direction along the optical path. Further, the fiber optic cable 232 may be coupled between the spectrometer 225 and the light source 201 for efficient transfer of light between the light source 201, to the window 220, and back to the spectrometer 225.

In an embodiment, the light source emits light at a spectrum of about 200-800 nm, and the spectrometer 225 also has a 200-800 nm wavelength range. The spectrometer 225 may be adapted to detect a spectrum of the reflected light received from the light coupling device 204, e.g., the light that has reflected off of a substrate in chamber 202 and back through the window 220 and been focused by the light coupling device 204 into the fiber optic cable 232.

In one embodiment, the controller 205 may direct the light source 201 to flash on and then receive a light spectrum from the spectrometer 225. The controller 205 may also keep the light source off and receive a second spectrum from the spectrometer 225 when the light source 201 is off. The controller 205 may subtract the second spectrum from the first spectrum to determine the reflectometry signal for a moment in time. The controller 205 may then mathematically fit the reflectometry signal to one or more thin film models to determine one or more optical thin film property of a film that is measured.

In some embodiments, the one or more optical thin film property may include film thickness, a refractive index (n), and/or an extinction coefficient (k) value. The refractive index is the ratio of the speed of light in a vacuum to the speed of light in the film. The extinction coefficient is a measure of how much light is absorbed in the film. The controller 205 may determine, using the n and k values, a composition of the film. The autonomous tool engine 221 may be configured to analyze the data of the one or more property of the film, determine a thickness of the film and/or determine a depth of a trench etched in the film.

In one embodiment, optical emission spectrometer (OES) 230 is connected to process chamber 202 via viewport 240. OES 230 may direct light into interior volume 206 of process chamber 202 and/or may measure light from the interior volume 206 in order to perform optical emission spectroscopy using the light. Flashes of light may be directed onto a plasma in the interior volume 206 of the process chamber 202 by the OES 230. The OES 230 may then receive spectra information associated with bulk plasma conditions in the chamber. The received spectra information may comprise information associated with the concentration of etch reactants and etch byproducts in the plasma. In particular, the spectra information may be associated with a ratio of etch reactants to etch byproducts. The ratio of the etch reactants to etch byproducts may change dramatically when an etch endpoint is reached (e.g., when a layer is fully etched and there is no more material from the layer to be etched). The autonomous tool engine 221 be configured to analyze the spectra measured from the interior volume 206 of the process chamber 202 to determine whether an etch endpoint has been reached, and/or to determine a thickness of a film, to determine one or more properties of the film, and/or to determine a depth of a trench etched in the film. The OES data and the reflectometry data may both be used to determine such properties and/or conditions in embodiments.

In some embodiments, autonomous tool engine 221 uses sensor measurements from reflectometer 203, OES 230 and one or more of sensors 235 to make decisions with respect to process chamber 202. Chamber controller 205 may determine, for example, whether maintenance is due for process chamber 202, a type of maintenance to be performed on process chamber 202, whether process chamber 202 is ready to be brought back into service after undergoing maintenance and seasoning, and so on using autonomous tool engine 221.

FIGS. 3-9 are flow charts for methods of training machine learning models and/or using trained machine learning models to make decisions for process chambers based on sensor measurements, according to embodiments. The methods may be performed with the components described with reference to FIGS. 1-2, as will be apparent. For example, methods may be performed by platform controller 120 or chamber controller 205 in embodiments. At least some operations of the methods may be performed by a processing logic that may comprise hardware (e.g., circuitry, dedicated logic, programmable logic, microcode, etc.), software (e.g., instructions run on a processing device to perform hardware simulation), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are performed in every embodiment. Other process flows are possible.

Figure 3:
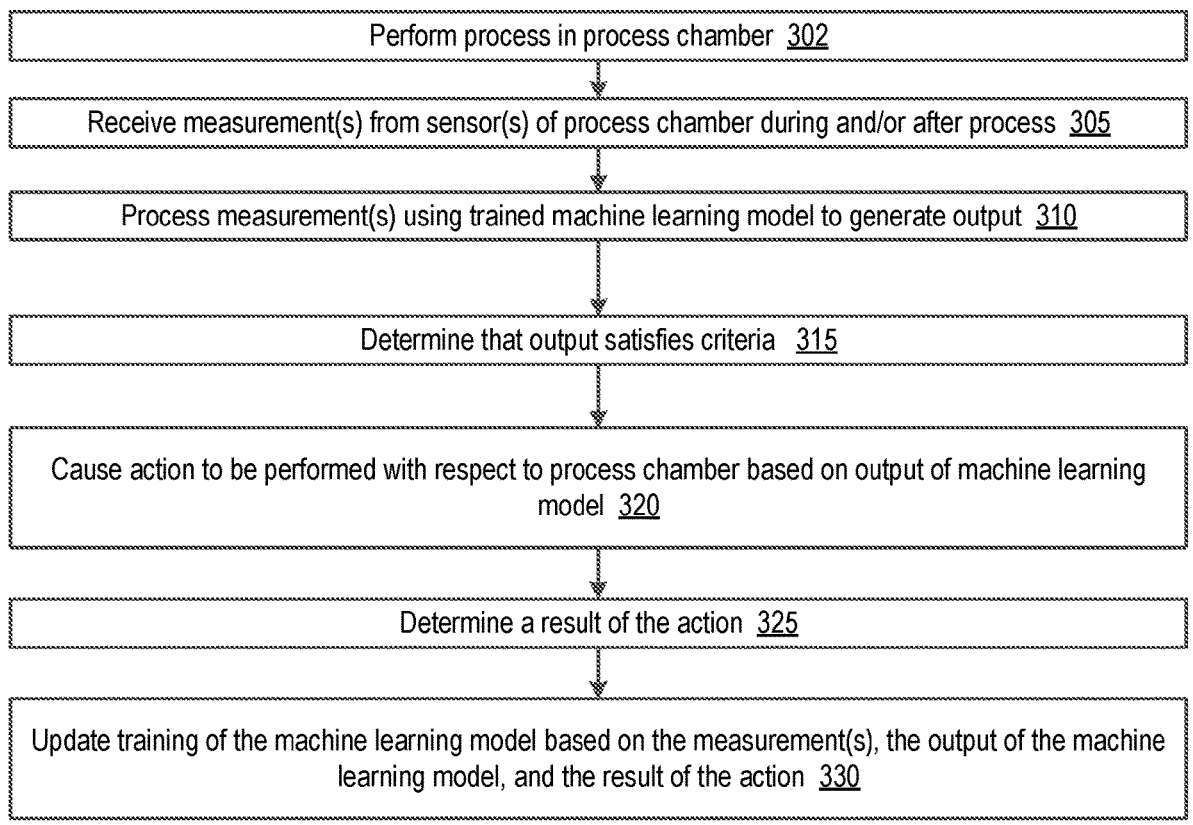
FIG. 3 is a flow chart for a method of automatically making decisions and performing actions by a process tool and/or substrate processing system, according to an embodiment.

FIG. 3 is a flow chart for a method 300 of automatically making decisions and performing actions by a process tool and/or substrate processing system, according to an embodiment. At block 302 of method 300, processing logic causes a processing chamber to perform a process, such as an etch process, a deposition process, a test process, or a seasoning process. At block 305, processing logic receives measurements from one or more sensors of the process chamber during and/or after the process. At block 310, processing logic processes the measurement or measurements using a trained machine learning model. Based on the processing of the measurement(s), the trained machine learning model generates an output. The output may be an trench depth, a film thickness, an indication as to whether an etch endpoint has been reached, an indication as to whether the process chamber should be scheduled for maintenance or an indication as to whether the process chamber should be returned to service. The trained machine learning model may have been trained as set forth herein above, and may correspond to any of the trained machine learning models set forth herein above.

At block 315, processing logic determines that the output satisfies one or more criteria. The criteria may include a trench depth criterion, a chamber condition index threshold, a yes/no criterion, or some other criterion. In the case of a trained machine learning model trained to detect an etch endpoint, the criterion may be a trench depth, and the criterion may be satisfied if a determined trench depth is equal to or greater than a target trench depth. In one embodiment, the trained machine learning model outputs a yes or a no, where a yes indicates that an etch endpoint has been reached and a no indicates that the etch endpoint has not yet been reached. In the case of a trained machine learning model trained to determine whether maintenance should be performed on a process chamber, an output may be a CCI or CPCI value, and a criterion may be satisfied if the determined CCI or CPCI value output by the trained machine learning model is below a CCI or CPCI threshold. In one embodiment, the trained machine learning model outputs a yes or a no, where a yes indicates that maintenance should be performed on the process chamber.

In one embodiment, the trained machine learning model outputs multiple maintenance classifications, and for each maintenance classification the trained machine learning model provides a yes indicating that the type of maintenance associated with that maintenance classification should be performed or a no indicating that the type of maintenance associated with that maintenance classification need not be performed. Examples of maintenance classifications include scheduled cleaning, part replacement for a first part, part replacement for a second part, and so on. In the case of a trained machine learning model trained to determine whether a process chamber that has undergone maintenance is ready to be returned to service after one or more seasoning processes have been performed on the process chamber, an output may be a CCI or CPCI value, and a criterion may be satisfied if the determined CCI or CPCI value output by the trained machine learning model is at or above a CCI or CPCI threshold. In one embodiment, the trained machine learning model outputs a yes or a no, where a yes indicates that no more seasoning is warranted for the process chamber (and that the process chamber is ready to return to service) and no indicates that one or more seasoning processes should still be performed on the process chamber (and that the process chamber is not ready to return to service).

At block 320, processing logic causes an action to be performed with respect to the process chamber based on the output of the machine learning model and whether the output satisfies the one or more criteria. With respect to a trained machine learning model trained to detect an etch endpoint, the action may be to stop an etch process. With respect to a trained machine learning model trained to detect when a process chamber should undergo maintenance, the action may be to flag the process chamber for maintenance, to take the process chamber out of service so that further product substrates are not processed by the process chamber and/or to schedule maintenance for the process chamber. With respect to a trained machine learning model trained to detect when a process chamber that has undergone maintenance and for which one or more iterations of a seasoning process have been performed on the process chamber, the action may be to place the process chamber back into service, to mark the process chamber are ready for a qualification test to be performed and/or to schedule a requalification test or process for the process chamber.

At block 325, processing logic determines a result of the action. In the case of a trained machine learning model trained to detect an etch endpoint, the result may be one or more optical critical dimension measurements, such as an optically measured trench depth. In the case of a trained machine learning model trained to automatically determine when a process chamber should undergo maintenance, a result of the action may be an indication from a technician as to whether maintenance was warranted or measured OCD values of substrates and/or an indication as to whether the measured OCD values are above or below one or more thresholds (e.g., deviate from target OCD values by more than a threshold amount). In the case of a trained machine learning model trained to automatically determine when a process that has undergone maintenance is ready to return to service, a result of the action may be a requalification test result, which may be obtained by performing a requalification process with a blanket wafer, test wafer, sensor wafer, bare wafer or other wafer in the process chamber and measuring one or more properties and/or conditions of the blanket wafer, test wafer, sensor wafer, bare wafer or other wafer and/or sensor measurements of the process chamber during and/or after the requalification process. Examples of wafer measurements include particle count, metal contamination, etch depth, layer thickness, and so on. In one embodiment, a result of the action is an indication that the process chamber passed or did not pass requalification.

At block 330, processing logic updates a training of the trained machine learning model based on the sensor measurements, the output of the machine learning model, and the result of the action. Accordingly, continuous learning may be performed to continuously update and improve the trained machine learning model. This enables the trained machine learning model to adapt to chamber conditions on an ongoing basis. The retraining of the trained machine learning model may be performed on-tool on a controller at which the trained machine learning model is deployed in embodiments.

Figure 4:
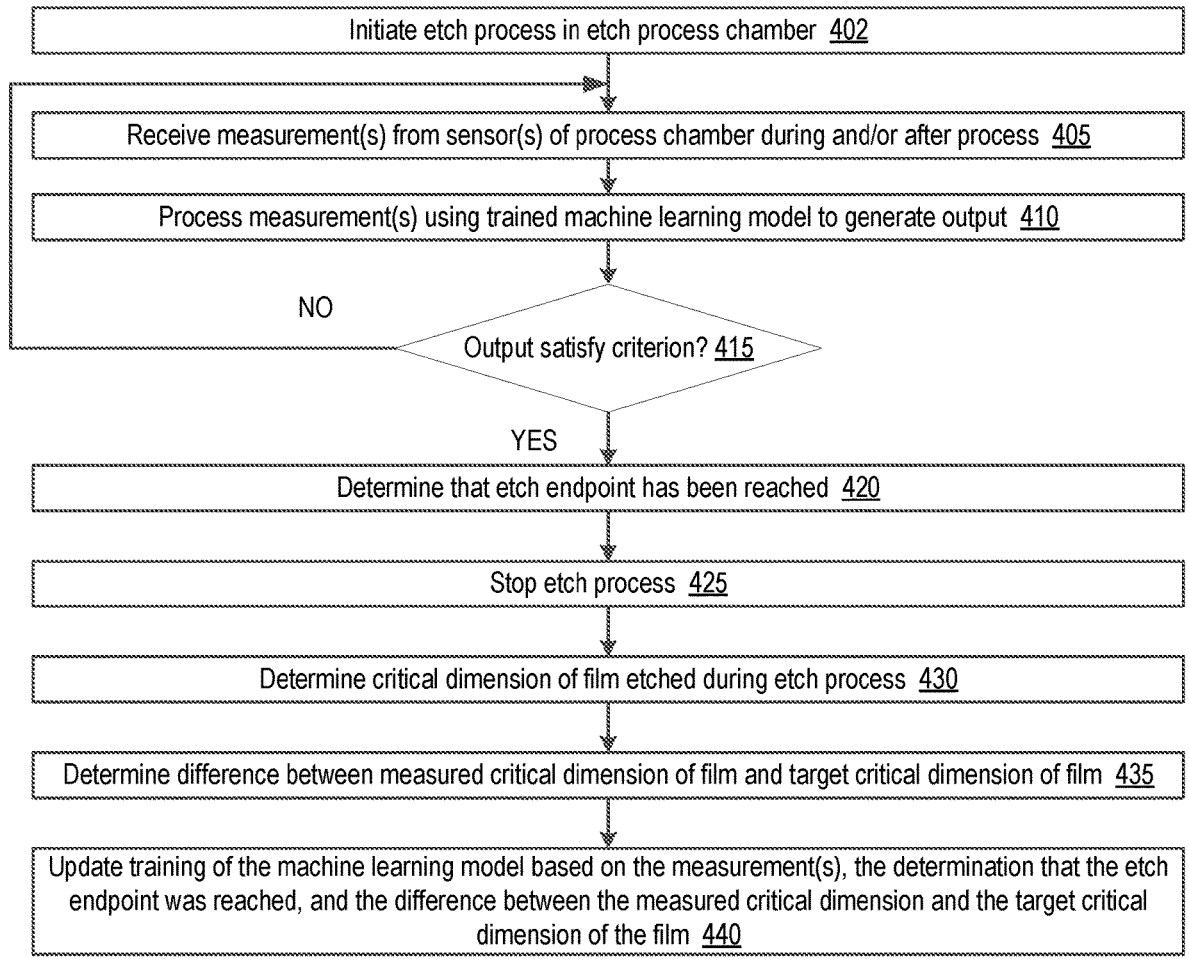
FIG. 4 is a flow chart for a method of automatically determining when to stop an etch process, according to an embodiment.

FIG. 4 is a flow chart for a method 400 of automatically determining when to stop an etch process, according to an embodiment. At block 402 of method 400, processing logic initiates an etch process in an etch chamber. The etch process may be performed on a product substrate having one or more films thereon. At block 405, processing logic receives one or more measurements from one or more optical sensors of the process chamber during and/or after the etch process. The optical sensors may include, for example, a reflectometry sensor and/or an optical emissions spectroscopy sensor. At block 410, processing logic processes the measurements using a trained machine learning model that has been trained to detect a trench depth, a film thickness and/or an etch endpoint condition. The trained machine learning model may have been trained to generate an output that indicates a trench depth and/or a film thickness and/or an output that indicates whether an etch endpoint has been reached.

At block 415, processing logic determines whether the output of the trained machine learning model satisfies an etch endpoint criterion. In one embodiment, processing logic compares an output trench depth with a target trench depth and/or an output film thickness with a target film thickness. In one embodiment, processing logic determines whether the output is an indication that an etch endpoint has been reached (e.g., which may be a yes/no output). If the output trench depth is less than the target trench depth, or if the film thickness is greater than the target film thickness, or if the output is an indication that an etch endpoint has not been reached, then the etch process continues and the method returns to block 405, at which additional sensor measurements are generated. If the output trench depth is equal to or greater than the target trench depth, or if the output is an indication that an etch endpoint has been reached, then the method continues to block 420.

At block 420, processing logic determines that the etch endpoint has been reached. At block 425, processing logic stops the etch process (or a step in the etch process). At block 430, processing logic determines a critical dimension (e.g., a trench depth) of the film that was etched during the etch process. The critical dimension may be determined during or after a downstream process in a manufacturing sequence for the substrate having the film. At block 435, processing logic determines a difference between the measured critical dimension of the film and a target critical dimension of the film (e.g., a difference between a target thickness or trench depth and a measured thickness or trench depth). At block 440, processing logic updates the training of the machine learning model based on the measurements received at block 405, the output from block 410 indicating that the etch endpoint was reached, and the difference between the measured critical dimension and the target critical dimension of the film. Accordingly, continuous learning may be performed to continuously update and improve the trained machine learning model. The retraining of the trained machine learning model may be performed on-tool on a controller at which the trained machine learning model is deployed in embodiments.

Figure 5:
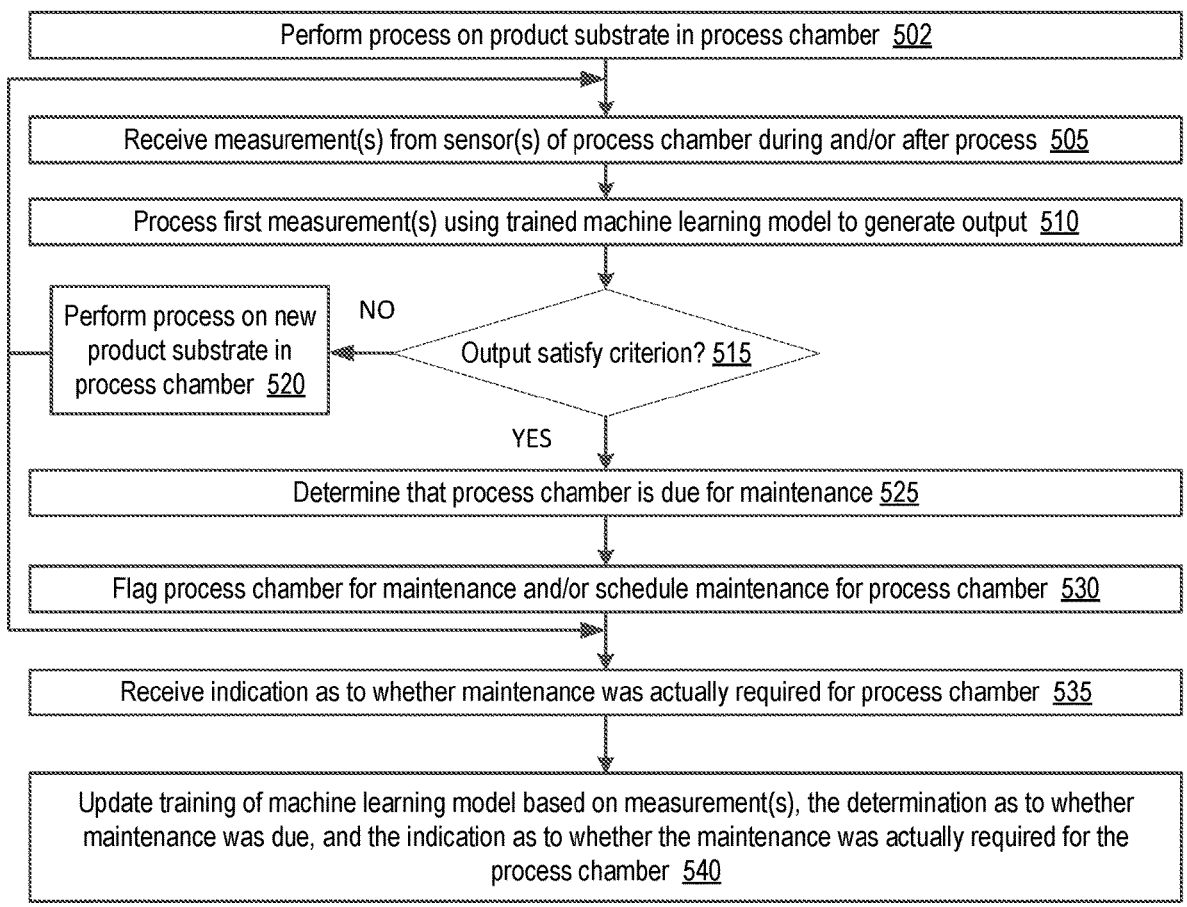
FIG. 5 is a flow chart for a method of automatically determining when to perform maintenance on a process chamber, according to an embodiment.

FIG. 5 is a flow chart for a method 500 of automatically determining when to perform maintenance on a process chamber, according to an embodiment. At block 502 of method 500, processing logic initiates process on a product substrate in chamber. The process may be an etch process, a deposition process, an anneal process, or some other process, for example. The process may be performed on a product substrate having one or more films thereon and/or may be performed to deposit a film thereon. At block 505, processing logic receives one or more measurements from a set of sensors of the process chamber during and/or after the process. At block 510, processing logic processes the measurements using a trained machine learning model that has been trained to determine whether maintenance should be performed on the process chamber. The trained machine learning model may have been trained to generate an output that indicates a CCI value or a CPCI value and/or an output that indicates whether maintenance is due and/or a type of maintenance to be performed.

At block 515, processing logic determines whether the output of the trained machine learning model satisfies criterion. In one embodiment, processing logic compares an output CCI with a CCI or CPCI threshold. If the CCI or CPCI value is below the CCI or CPCI threshold, then processing logic may determine that the output satisfies the criterion. If the CCI or CPCI value is above the CCI or CPCI threshold, then the criterion may not be satisfied. In one embodiment, the output of the trained machine learning model is a yes/no indication as to whether maintenance should be performed. If the output is a yes, that maintenance should be performed (or that a particular type of maintenance should be performed), the criterion is satisfied. If the output is a no, that maintenance should not be performed, then the criterion is not satisfied. If the criterion is not satisfied, the method continues to block 520. If the criterion is satisfied, the method proceeds to block 525.

At block 520, processing logic initiates the process on a new substrate (after causing a robot arm to remove the first substrate from the process chamber and to insert the new substrate into the process chamber). The method then returns to block 505 and sensor measurements associated with performance of the process on the new substrate are received. Additionally, the method may proceed to block 535.

At block 525, processing logic determines that the process chamber is due for maintenance. At block 530, processing logic may flag the process chamber for maintenance (e.g., a cleaning) and/or may actively schedule a cleaning for the process chamber. At block 535, processing logic may receive an indication as to whether maintenance was actually performed on the process chamber. Processing logic may additionally or alternatively receive an indication as to a state of the process chamber and/or critical dimension measurements of product substrates processed by the process chamber at block 502 and/or block 520. At block 540, processing logic updates the training of the machine learning model based on the measurements received at block 505, the output from block 510 indicating whether maintenance should be performed, and at least one of the indication as to whether maintenance was performed and/or a difference between measured critical dimension(s) and the target critical dimension(s) of one or more film on the product substrate. Accordingly, continuous learning may be performed to continuously update and improve the trained machine learning model. The retraining of the trained machine learning model may be performed on-tool on a controller at which the trained machine learning model is deployed in embodiments.

Figure 6:
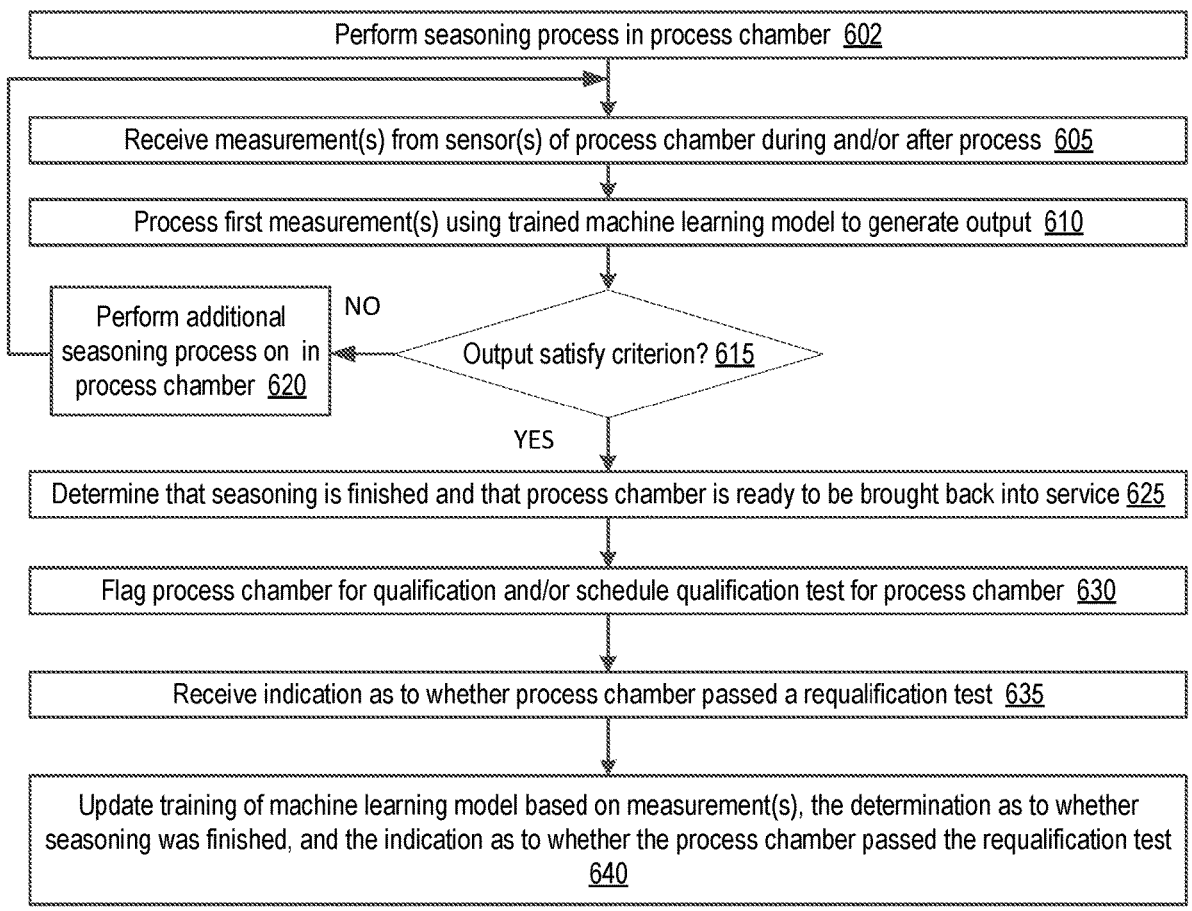
FIG. 6 is a flow chart for a method of automatically determining when to return a process chamber back to service after maintenance has been performed, according to an embodiment.

FIG. 6 is a flow chart for a method 600 of automatically determining when to return a process chamber back to service after maintenance has been performed, according to an embodiment. At block 602 of method 600, processing logic initiates seasoning process in a chamber. The seasoning process is a chamber conditioning process that causes a state of the process chamber to reach a known state. Proper seasoning or conditioning of a process chamber after maintenance (e.g., after a part replacement and/or after a cleaning process such as a wet clean process or a dry clean process) improves wafer-to-wafer process repeatability. In one embodiment, the seasoning process cause passivation of reactor surfaces by plasma generated species, which can change the reactive sticking coefficients of radicals. Chamber seasoning may be performed to ensure that critical dimensions of devices are consistently reproduced by enabling a uniform plasma with the same ion density, electron temperature, and fluxes to be repeated wafer-to-wafer. The process may be performed on a blanket substrate, bare substrate, test substrate, etc.

At block 605, processing logic receives one or more measurements from a set of sensors of the process chamber during and/or after the process. At block 610, processing logic processes the measurements using a trained machine learning model that has been trained to determine whether seasoning is complete and/or whether a process chamber is ready to be returned to service. The trained machine learning model may have been trained to generate an output that indicates an estimated CCI and/or an output that indicates whether seasoning is complete (and that the process chamber can be returned to service).

At block 615, processing logic determines whether the output of the trained machine learning model satisfies a criterion. In one embodiment, processing logic compares an output estimated CCI with a CCI threshold. If the estimated CCI is at or above the CCI threshold, then processing logic may determine that the output satisfies the criterion. If the estimated CCI is below the CCI threshold, then the criterion may not be satisfied. In one embodiment, the output of the trained machine learning model is a yes/no indication as to whether seasoning is complete. If the output is a no, that seasoning is not complete, the criterion is not satisfied. If the output is a yes, that seasoning is complete, then the criterion is satisfied. If the criterion is not satisfied, the method continues to block 620. If the criterion is satisfied, the method proceeds to block 625.

At block 620, processing logic initiates another iteration of the seasoning process, optionally on a new substrate (after causing a robot arm to remove the first substrate from the process chamber and to insert the new substrate into the process chamber). The method then returns to block 605 and sensor measurements associated with performance of the process on the new substrate are received.

At block 625, processing logic determines that the process chamber is ready to be requalified and/or is ready to return to service (to be used on product substrates). At block 630, processing logic may flag the process chamber for qualification and/or may schedule a requalification process. At block 635, processing logic may receive an indication as to whether the process chamber passed the requalification test. The indication may include one or more measurement results of one or more test substrate that was processed using a test recipe or test process. In one embodiment, a blanket wafer etch process is performed on a blanket wafer, a patterned wafer etch process is performed on a patterned wafer and/or a particle test process is performed on a particle wafer (e.g., which may be a blank wafer or a blanket wafer). From the blanket wafer etch process a mean blanket wafer etch rate and a blanket wafer etch uniformity may be measured. From the patterned wafer etch process a mean patterned wafer etch rate and a patterned wafer etch uniformity may be measured. After the particle test, particles may be counted on the particle wafer. The measurement results may include, for example, an on-wafer particle count, metal contamination, film thickness, film composition, blanket wafer etch rate, blanket wafer etch uniformity, patterned wafer etch rate, patterned wafer etch uniformity, and so on. Processing logic may additionally or alternatively receive an indication as to a state of the process chamber. An actual CCI value may be determined for the process chamber based on the measurement results.

At block 640, processing logic updates the training of the machine learning model based on the measurements received at block 605, the output from block 610 indicating whether maintenance should be performed, and the indication as to whether the process chamber passed requalification tests and/or results of requalification tests. Accordingly, continuous learning may be performed to continuously update and improve the trained machine learning model. The retraining of the trained machine learning model may be performed on-tool on a controller at which the trained machine learning model is deployed in embodiments.

Figure 7:
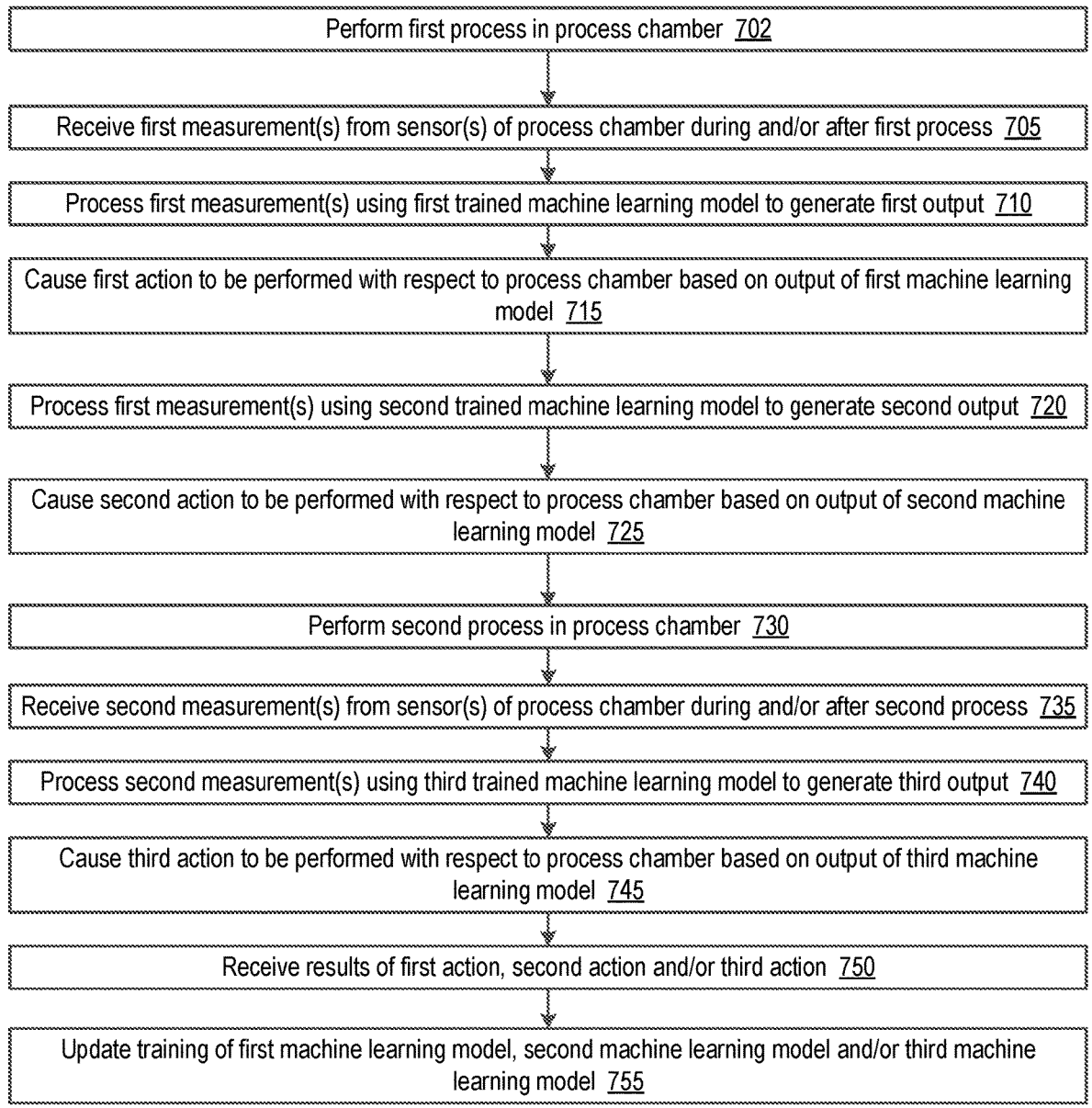
FIG. 7 is a flow chart for a method of making multiple decisions autonomously by a process tool and/or substrate processing system, according to an embodiment.

FIG. 7 is a flow chart for a method 700 of making multiple decisions autonomously by a process tool and/or substrate processing system, according to an embodiment. At block 702 of method 700, processing logic causes a processing chamber to perform a first process, such as an etch process, a deposition process, a test process, or a seasoning process. At block 705, processing logic receives first measurements from one or more sensors of the process chamber during and/or after the process. At block 710, processing logic processes the first measurement or measurements (or a first subset of the first measurements) using a first trained machine learning model such as a machine learning model trained to perform etch endpoint detection. Based on the processing of the measurement(s), the first trained machine learning model generates an output. The output may be an trench depth, a film thickness, an indication as to whether an etch endpoint has been reached, an indication as to whether the process chamber should be scheduled for maintenance or an indication as to whether the process chamber should be returned to service. The first trained machine learning model may have been trained as set forth herein above, and may correspond to any of the trained machine learning models set forth herein above.

At block 715, processing logic determines that the first output satisfies one or more first criteria. The first criteria may include a trench depth criterion, a chamber condition index threshold, a yes/no criterion, or some other criterion. Processing logic causes a first action to be performed with respect to the process chamber based on the first output of the first trained machine learning model satisfying a first criterion.

At block 720, processing logic processes the first measurement or measurements (or a second subset of the first measurements) using a second trained machine learning model. Based on the processing of the measurement(s), the second trained machine learning model generates a second output. The second output may be a trench depth, a film thickness, an indication as to whether an etch endpoint has been reached, an indication as to whether the process chamber should be scheduled for maintenance or an indication as to whether the process chamber should be returned to service. The second trained machine learning model may have been trained as set forth herein above, and may correspond to any of the trained machine learning models set forth herein above.

At block 725, processing logic determines that the second output satisfies one or more second criteria (which are different from the first criteria). The second criteria may include a trench depth criterion, a film thickness criterion, a chamber condition index threshold, a yes/no criterion, or some other criterion. Processing logic causes a second action to be performed with respect to the process chamber based on the second output of the second trained machine learning model satisfying a second criterion.

At block 730, processing logic causes the processing chamber to perform a second process, such as an etch process, a deposition process, a test process, or a seasoning process. The second process may be different from or the same as the first process performed at block 702. For example, the first process may be an etch process performed on a product substrate and the second process may be a chamber seasoning process performed after maintenance was scheduled on the process chamber. At block 735, processing logic receives second measurements from the one or more sensors of the process chamber during and/or after the second process. At block 740, processing logic processes the second measurement or measurements (or a subset of the second measurements) using a third trained machine learning model such as a machine learning model trained to detect when seasoning of a process chamber is complete. Based on the processing of the second measurement(s), the third trained machine learning model generates a third output. The third output may be an trench depth, a film thickness, an indication as to whether an etch endpoint has been reached, an indication as to whether the process chamber should be scheduled for maintenance or an indication as to whether the process chamber should be returned to service. The third trained machine learning model may have been trained as set forth herein above, and may correspond to any of the trained machine learning models set forth herein above.

At block 745, processing logic determines that the third output satisfies one or more third criteria. The third criteria may include a trench depth criterion, a chamber condition index threshold, a yes/no criterion, or some other criterion. Processing logic causes a third action to be performed with respect to the process chamber based on the third output of the third trained machine learning model satisfying a third criterion.

At block 750, processing logic receives results of the first action, second action and/or third action. At block 755, processing logic updates a training of the first trained machine learning model, the second trained machine learning model and/or the third trained machine learning model based on the results of the first, second and third actions, the first, second and third outputs, and the first and second measurements, respectively.

Figure 8:
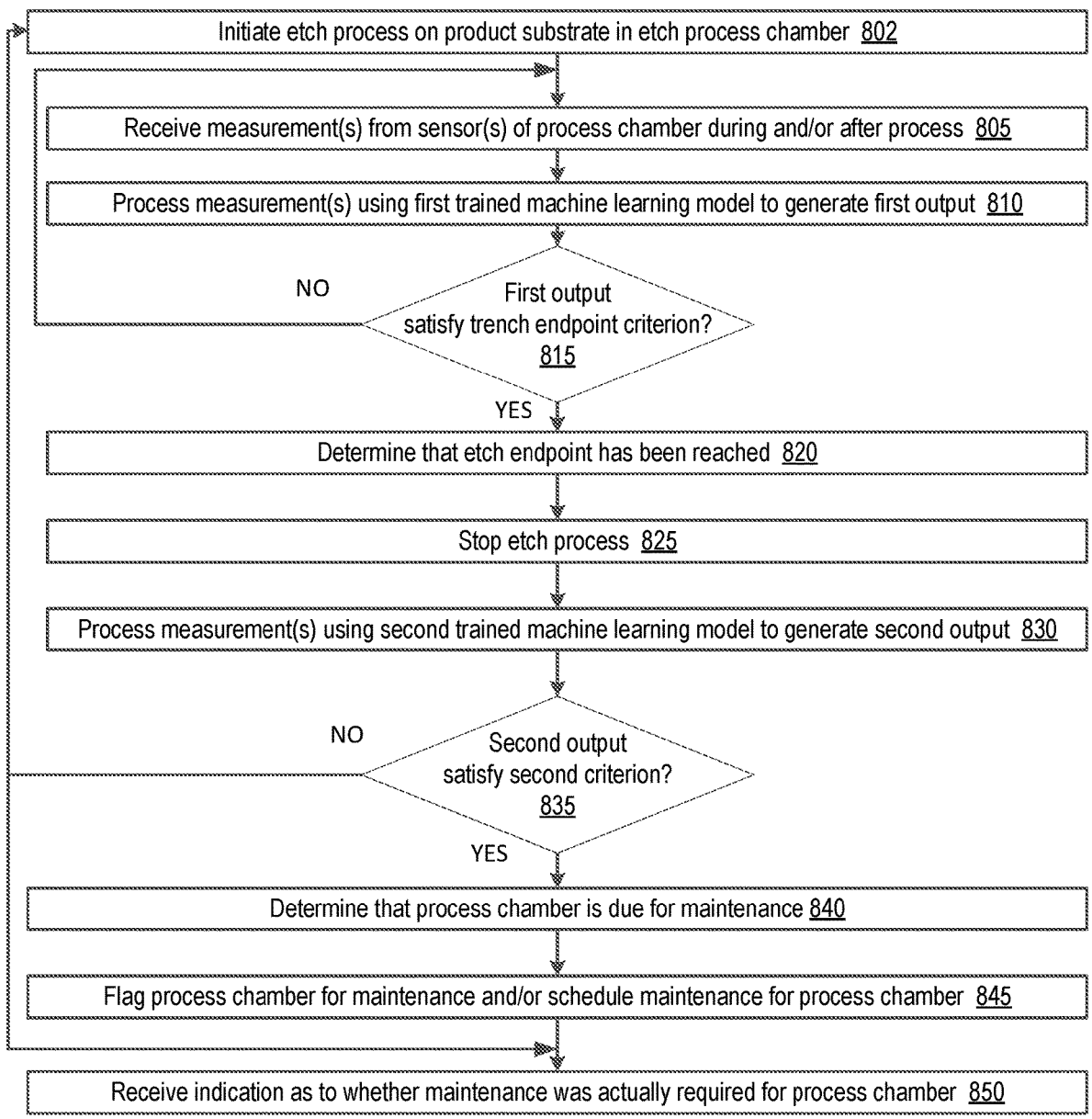
FIG. 8 is a flow chart for a method of using a set of sensor data to both determine when an etch endpoint is reached and to determine whether to schedule maintenance for an etch process chamber, according to an embodiment.

FIG. 8 is a flow chart for a method 800 of using a set of sensor data to both determine when an etch endpoint is reached and to determine whether to schedule maintenance for an etch process chamber, according to an embodiment. At block 802 of method 800, processing logic initiates an etch process in an etch chamber. The etch process may be performed on a product substrate having one or more films thereon. At block 805, processing logic receives one or more measurements from one or more optical sensors of the process chamber during and/or after the etch process. At block 810, processing logic processes the measurements (or a first subset of the measurements such as one or more optical measurements from the received measurements) using a first trained machine learning model that has been trained to detect a trench depth, a film thickness and/or an etch endpoint condition. The trained machine learning model may have been trained to generate an output that indicates a trench depth, a film thickness and/or an output that indicates whether an etch endpoint has been reached.

At block 815, processing logic determines whether the output of the trained machine learning model satisfies an etch endpoint criterion. If the output fails to satisfy the trench endpoint criterion the method returns to block 805, at which additional sensor measurements are generated. If the output satisfies the trench endpoint criterion, then the method continues to block 820.

At block 820, processing logic determines that the etch endpoint has been reached. At block 825, processing logic stops the etch process (or a step in the etch process).

At block 830, processing logic processes the measurements (or a second subset of the measurements) using a second trained machine learning model that has been trained to determine whether maintenance should be performed on the process chamber. The second trained machine learning model may have been trained to generate an output that indicates a CCI and/or an output that indicates whether maintenance is due and/or a type of maintenance to be performed.

At block 835, processing logic determines whether the output of the trained machine learning model satisfies a second criterion. If the output satisfies the second criterion, the method proceeds to block 840. If the output fails to satisfy the second criterion, the method returns to block 802 and the etch process is performed on a new substrate.

At block 840, processing logic determines that the process chamber is due for maintenance. At block 845, processing logic may flag the process chamber for maintenance (e.g., a cleaning) and/or may actively schedule a cleaning for the process chamber. At block 850, processing logic may receive an indication as to whether maintenance was actually performed on the process chamber.

Processing logic may update a training of both the first trained machine learning model and the second trained machine learning model based on the sensor measurements, the respective outputs, and indications as to whether the respective outputs were correct outputs.

Figure 9:
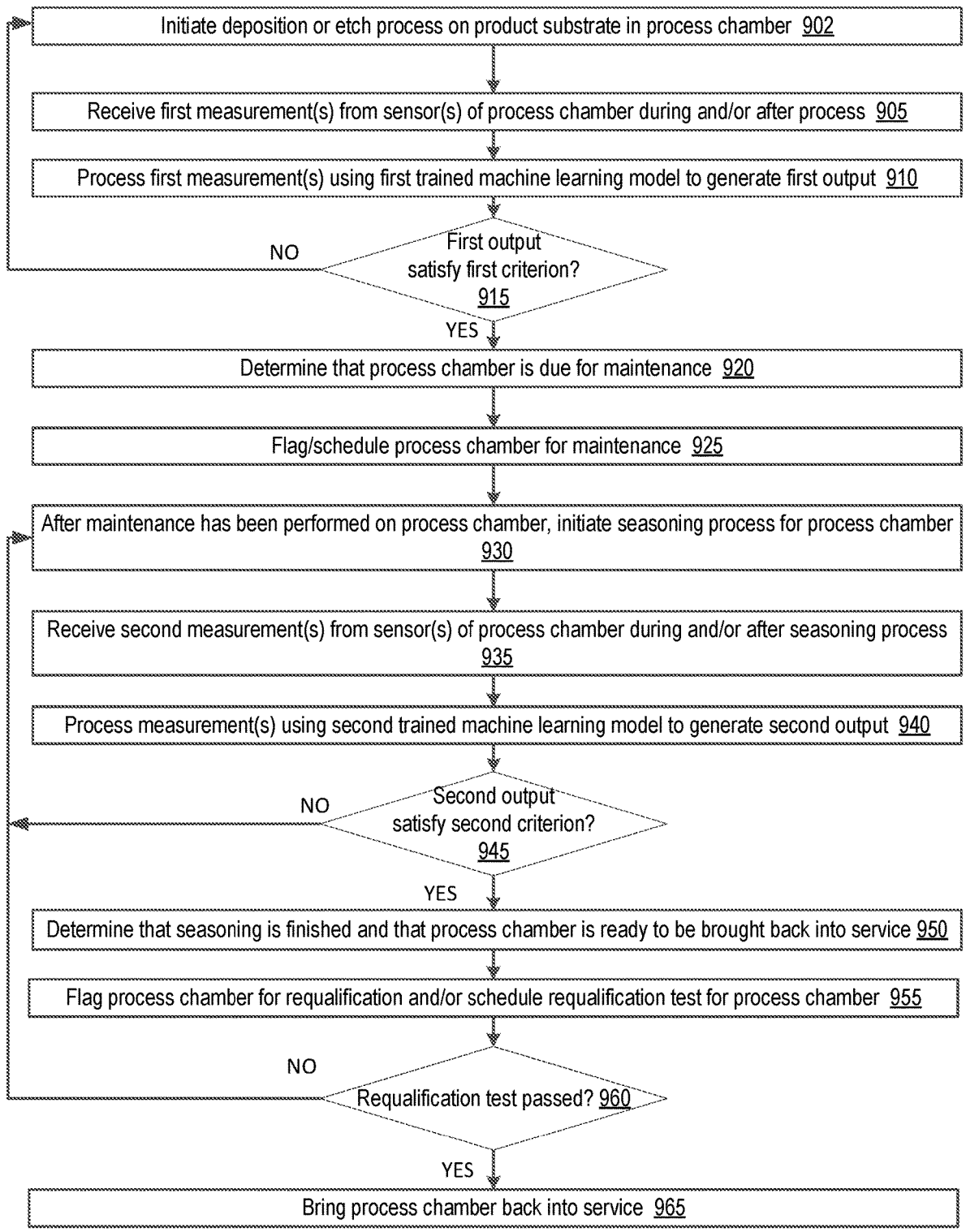
FIG. 9 is a flow chart for a method of automatically determining when to schedule a process chamber for maintenance and when to return the process chamber back to service after maintenance, according to an embodiment.

FIG. 9 is a flow chart for a method 900 of automatically determining when to schedule a process chamber for maintenance and when to return the process chamber back to service after maintenance, according to an embodiment. At block 902 of method 900, processing logic initiates process on a product substrate in a process chamber. The process may be an etch process, a deposition process, an anneal process, or some other process, for example. The process may be performed on a product substrate having one or more films thereon and/or may be performed to deposit a film thereon. At block 905, processing logic receives first measurements from a set of sensors of the process chamber during and/or after the first process. At block 910, processing logic processes the first measurements using a first trained machine learning model that has been trained to determine whether maintenance should be performed on the process chamber. The trained machine learning model may have been trained to generate an output that indicates a CCI and/or an output that indicates whether maintenance is due and/or a type of maintenance to be performed.

At block 915, processing logic determines whether the first output of the first trained machine learning model satisfies one or more first criteria (e.g., whether an output CCI value is below a CCI threshold). If the first output satisfies the one or more first criteria, the method continues to block 920. If the first output fails to satisfy the one or more first criteria, the method returns to block 902 and the first process is performed on a new substrate in the process chamber.

At block 920, processing logic determines that the process chamber is due for maintenance. At block 925, processing logic may flag the process chamber for maintenance (e.g., a cleaning) and/or may actively schedule a cleaning for the process chamber.

At block 930, after maintenance has been performed on the process chamber, processing logic may initiate a seasoning process for the process chamber. At block 935, processing logic receives second measurements from the set of sensors of the process chamber during and/or after the seasoning process. At block 940, processing logic processes the second measurements using a second trained machine learning model that has been trained to determine whether seasoning is complete and/or whether the process chamber is ready to be returned to service. The second trained machine learning model may have been trained to generate a second output that indicates a CCI and/or a second output that indicates whether seasoning is complete (and that the process chamber can be returned to service).

At block 945, processing logic determines whether the second output of the trained machine learning model satisfies one or more second criteria. In one embodiment, processing logic compares an output CCI with a CCI threshold. If the CCI is at or above the CCI threshold, then processing logic may determine that the output satisfies the second criterion. If the CCI is below the CCI threshold, then the second criterion may not be satisfied. If the second criterion is not satisfied, the method continues and returns block 930 and another seasoning process is performed on the process chamber. If the criterion is satisfied, the method proceeds to block 950.

At block 950, processing logic determines that seasoning is finished and that the process chamber is ready to be requalified and/or is ready to return to service (to be used on product substrates). At block 955, processing logic may flag the process chamber for qualification and/or may schedule a requalification process. At block 960, processing logic may receive an indication as to whether the process chamber passed a requalification test. Processing logic may additionally or alternatively receive an indication as to a state of the process chamber. If the process chamber failed to pass the requalification test, the method returns to block 930 and another seasoning process is performed on the process chamber. If the process chamber passed the requalification test, the method continues to block 965. At block 965, processing logic brings the process back into service. Processing logic may also update a training of the first and/or second trained machine learning models as discussed herein.

Figure 10:
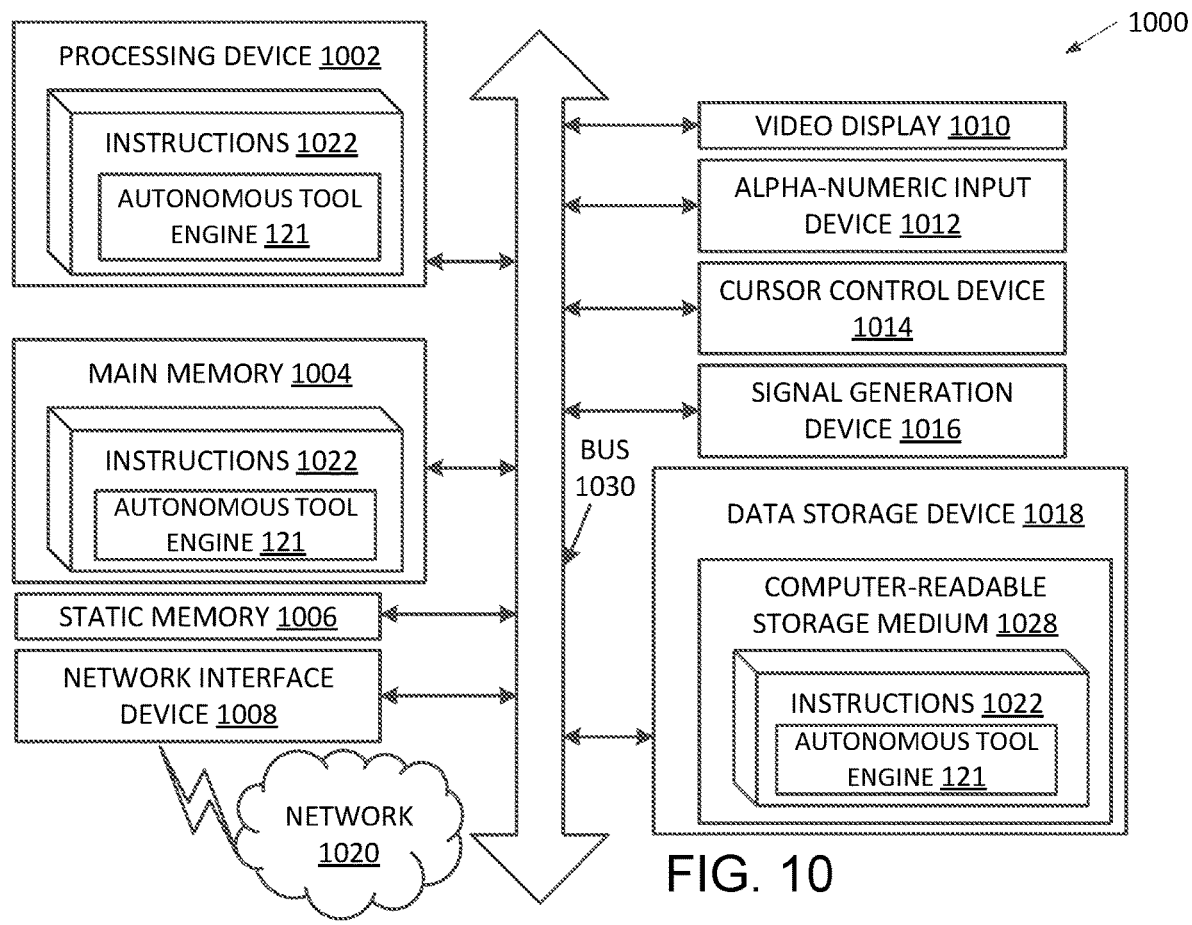
FIG. 10 illustrates a diagrammatic representation of a machine in the example form of a computing device within which a set of instructions, for causing the machine to perform any one or more of the methodologies discussed herein, may be executed.

FIG. 10 illustrates a diagrammatic representation of a machine in the example form of a computing device 1000 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The example computing device 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), hard disk (magnetic storage) etc.), and a secondary memory (e.g., a data storage device 1018), which communicate with each other via a bus 1030.

Processing device 1002 represents one or more general-purpose processors such as a microprocessor, central processing unit, or the like. More particularly, the processing device 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. Processing device 1002 is configured to execute the processing logic (instructions 1022) for performing the operations and steps discussed herein.

The computing device 1000 may further include a network interface device 1008. The computing device 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1016 (e.g., a speaker).

The data storage device 1018 may include a machine-readable storage medium (or more specifically a computer-readable storage medium) 1028 on which is stored one or more sets of instructions 1022 embodying any one or more of the methodologies or functions described herein. The instructions 1022 may also reside, completely or at least partially, within the main memory 1004 and/or within the processing device 1002 during execution thereof by the computer system 1000, the main memory 1004 and the processing device 1002 also constituting computer-readable storage media.

The computer-readable storage medium 1028 may also be used to store an autonomous tool engine 121, and/or a software library containing methods that call an autonomous tool engine 121. While the computer-readable storage medium 1028 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies described herein. The term "computer-readable storage medium" shall accordingly be taken to include, but not be limited to, non-transitory computer readable media such as solid-state memories, and optical and magnetic media.

The modules, components and other features described herein (for example in relation to FIGS. 1-2) can be implemented as discrete hardware components or integrated in the functionality of hardware components such as ASICS, FPGAs, DSPs or similar devices. In addition, the modules can be implemented as firmware or functional circuitry within hardware devices. Further, the modules can be implemented in any combination of hardware devices and software components, or only in software.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a target result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving", "identifying", "determining", "selecting", "providing", "storing", or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the discussed purposes, or it may comprise a general purpose computer system selectively programmed by a computer program stored in the computer system. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A tool cluster for substrate processing, comprising:
one or more transfer chambers;
a plurality of process chambers connected to the one or more transfer chambers, the plurality of process chambers comprising a first process chamber comprising a first plurality of sensors and a second process chamber comprising a second plurality of sensors; and
a computing device at the tool cluster, wherein the computing device is to:
receive a first set of measurements from at least one of the first plurality of sensors of the first process chamber during or after a first instance of a process performed within the first process chamber, wherein the first set of measurements comprise optical measurements, power measurements, and pressure measurements;
process the first set of measurements using a trained machine learning model, wherein the trained machine learning model is to generate a first output based on processing of the first set of measurements;
cause a first action to be performed with respect to the first process chamber based on the first output of the trained machine learning model;
determine a first result of the first action; and
update a training of the trained machine learning model based on the first set of measurements, the first output, and the first result of the first action.

2. The tool cluster of claim 1, wherein the process is a semiconductor manufacturing process, and wherein the plurality of process chambers are configured to perform the semiconductor manufacturing process.

3. The tool cluster of claim 1, wherein the computing device is further to:
receive one or more second measurements from at least one of the second plurality of sensors of the second process chamber during or after a second instance of the process performed within the second process chamber;
process the one or more second measurements using the trained machine learning model to generate a second output;
cause a second action to be performed with respect to the second process chamber based on the second output of the trained machine learning model;
determine a second result of the second action; and
update the training of the trained machine learning model based on the one or more second measurements, the second output, and the second result of the second action.

4. The tool cluster of claim 1, further comprising:
a factory interface connected to the one or more transfer chambers via one or more load lock;
wherein the computing device is an on-tool computing device that is attached to at least one of a transfer chamber of the one or more transfer chambers, a process chamber of the plurality of process chambers, or the factory interface; and
wherein the computing device is to update the training of the trained machine learning model without first transmitting the first set of measurements to a remote computing device.

5. The tool cluster of claim 1, wherein the first process chamber and the second process chamber are etch chambers, and wherein the process is an etch process.

6. The tool cluster of claim 5, wherein the first set of measurements comprise a reflectometry measurement of a film on a substrate generated during the first instance of the process, wherein the first output comprises at least one of an estimated thickness or an estimated trench depth of the film, wherein the first action comprises stopping the etch process, and wherein the first result of the first action comprises at least one of a) a difference between a measured thickness of the film and the estimated film thickness of the film or b) a difference between a measured trench depth of the film and the estimated trench depth of the film.

7. The tool cluster of claim 1, wherein the process comprises a seasoning process performed on the first process chamber after performing maintenance on the first process chamber, wherein the first output comprises an indication that the first process chamber is ready to be brought back into service, wherein the first action comprises a test process to be run on a test substrate in the first process chamber, and wherein the first result of the first action comprises one or more measurements of the test substrate generated during or after the test process.

8. The tool cluster of claim 1, wherein the process comprises a deposition process or an etch process performed on a substrate in the first process chamber, wherein the first output comprises an indication that the first process chamber is due for maintenance, wherein the first action comprises flagging the first process chamber for maintenance, and wherein the first result of the first action comprises an indication as to whether the maintenance was required.

9. The tool cluster of claim 1, wherein the trained machine learning model comprises a neural network.

10. The tool cluster of claim 1, wherein the computing device is further to:
determine when to perform preventative maintenance on the first process chamber and when to perform preventative maintenance on the second process chamber;
after preventative maintenance has been performed on the first process chamber, determine when to bring the first process chamber back into service; and
after preventative maintenance has been performed on the second process chamber, determine when to bring the second process chamber back into service.

11. A system for substrate processing, comprising:
a process chamber;
a plurality of sensors connected to the process chamber; and
a computing device at the process chamber, wherein the computing device is to:
receive one or more measurements from at least one of the plurality of sensors during or after a process performed within the process chamber;
process a first set of measurements using a trained machine learning model, wherein the first set of measurements comprise optical measurements, power measurements, and pressure measurements, and wherein the trained machine learning model is to generate an output based on processing of the first set of measurements;
cause an action to be performed with respect to the process chamber based on the output of the trained machine learning model;
determine a result of the action; and
update a training of the trained machine learning model based on the first set of measurements, the output, and the result of the action.

12. The system of claim 11, wherein the first set of measurements comprise a reflectometry measurement of a film on a substrate generated during the process, wherein the output comprises at least one of an estimated thickness or an estimated depth of the film, and wherein the action comprises stopping the process.

13. The system of claim 11, wherein the process comprises a seasoning process performed on the process chamber after performing maintenance on the process chamber, and wherein the output comprises an indication that the process chamber is ready to be brought back into service.

14. The system of claim 11, wherein the output comprises an indication that the process chamber is due for maintenance, and wherein the action comprises flagging the process chamber for maintenance.

15. The system of claim 11, wherein the trained machine learning model comprises a neural network.

16. The system of claim 11, wherein the computing device is further to:
   determine when to perform preventative maintenance on the process chamber; and
   after preventative maintenance has been performed on the process chamber, determine when to bring the process chamber back into service.

17. A tool cluster for substrate processing, comprising:
   one or more transfer chambers;
   a plurality of process chambers connected to the one or more transfer chambers, the plurality of process chambers comprising a process chamber comprising a plurality of sensors; and
   a computing device at the tool cluster, wherein the computing device is to:
      receive a first set of measurements generated by the plurality of sensors of the process chamber during or after a process is performed within the process chamber, wherein the first set of measurements comprise optical measurements, power measurements, and pressure measurements;
      determine that the process chamber is due for maintenance based on processing the first set of measurements from the plurality of sensors using a first trained machine learning model; and
      after maintenance has been performed on the process chamber, receive a second set of measurements generated by the plurality of sensors of the process chamber during or after a seasoning process is performed within the process chamber; and
      determine that the process chamber is ready to be brought back into service based on processing the second set of measurements from the plurality of sensors using a second trained machine learning model.

* * * * *